(12) United States Patent
Tsukada

(10) Patent No.: US 6,898,141 B2
(45) Date of Patent: May 24, 2005

(54) DYNAMIC SEMICONDUCTOR MEMORY DEVICE AND METHOD OF CONTROLLING REFRESH THEREOF

(75) Inventor: Shyuichi Tsukada, Tokyo (JP)

(73) Assignee: Elpida Memory Inc., Tokyo (JP)

(*) Notice: Subject to any disclaimer, the term of this patent is extended or adjusted under 35 U.S.C. 154(b) by 362 days.

(21) Appl. No.: 10/317,553

(22) Filed: Dec. 12, 2002

(65) Prior Publication Data

US 2003/0112690 A1 Jun. 19, 2003

(30) Foreign Application Priority Data

Dec. 13, 2001 (JP) .................................. 2001-380116

(51) Int. Cl.[7] .................................................. G11C 7/00
(52) U.S. Cl. .............. 365/222; 365/189.05; 365/230.06
(58) Field of Search ........................... 365/222, 230.06, 365/203, 189.05

(56) References Cited

U.S. PATENT DOCUMENTS

| 6,094,705 A | * | 7/2000 | Song ........................... 711/106 |
| 6,504,787 B2 | * | 1/2003 | Tsubouchi et al. ...... 365/230.05 |
| 6,510,094 B2 | * | 1/2003 | Chung et al. ................ 365/222 |
| 6,813,212 B2 | * | 11/2004 | Takahashi et al. ........... 365/222 |

FOREIGN PATENT DOCUMENTS

| JP | 2991114 | 12/1997 |
| JP | 2000-113667 | 4/2000 |

* cited by examiner

Primary Examiner—Richard Elms
Assistant Examiner—Toan Le
(74) Attorney, Agent, or Firm—Katten Muchin Zavis Rosenman

(57) ABSTRACT

A dynamic semiconductor memory device and a refresh control method for reducing refresh current are disclosed. The device according to the present invention to include a flip-flop, receiving a word line supplied from a row decoder and a write command signal for commanding write operation, for storing and holding a value indicating the presence of a write history when the word line and the write command signal are activated, and a control circuit, receiving an output of the flip-flop, a word line, a refresh command signal on a word line, for exercising control so that when the word line and the refresh command signal are activated, in case of the output of said flop-flop indicating a value representative of the presence of the write history, a normal refresh operation is performed, and in case of the output of said latch circuit indicating a value representative of the absence of the write history, one of control signals for controlling sensing operation by a sense amplifier is inactivated, thereby stopping the refresh operation.

51 Claims, 14 Drawing Sheets

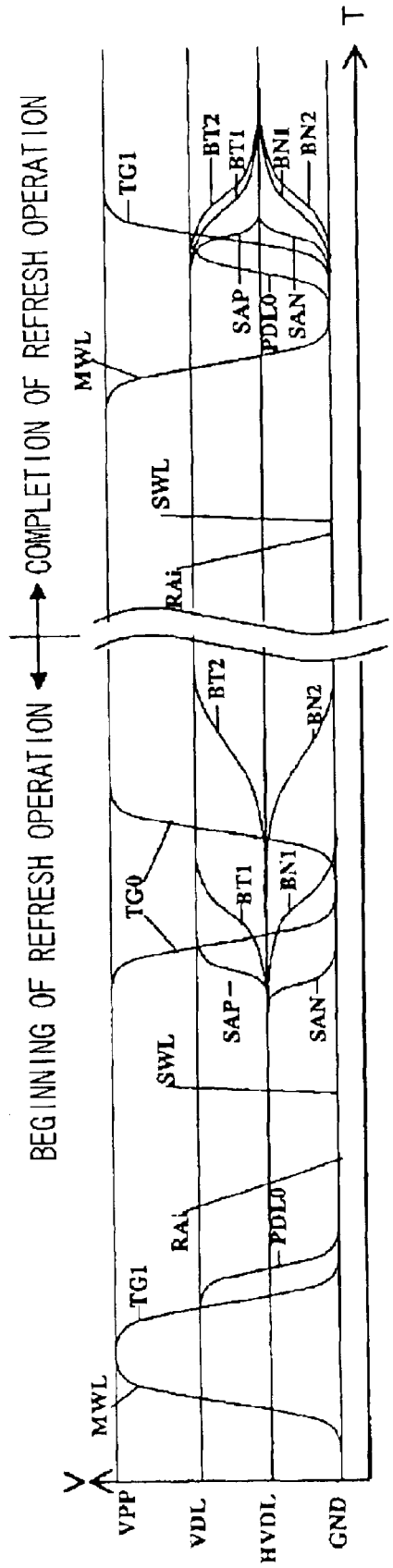
FIG. 8a WHEN RAi↑ IS STOPPED WITH ABSENCE OF WRITE HISTORY
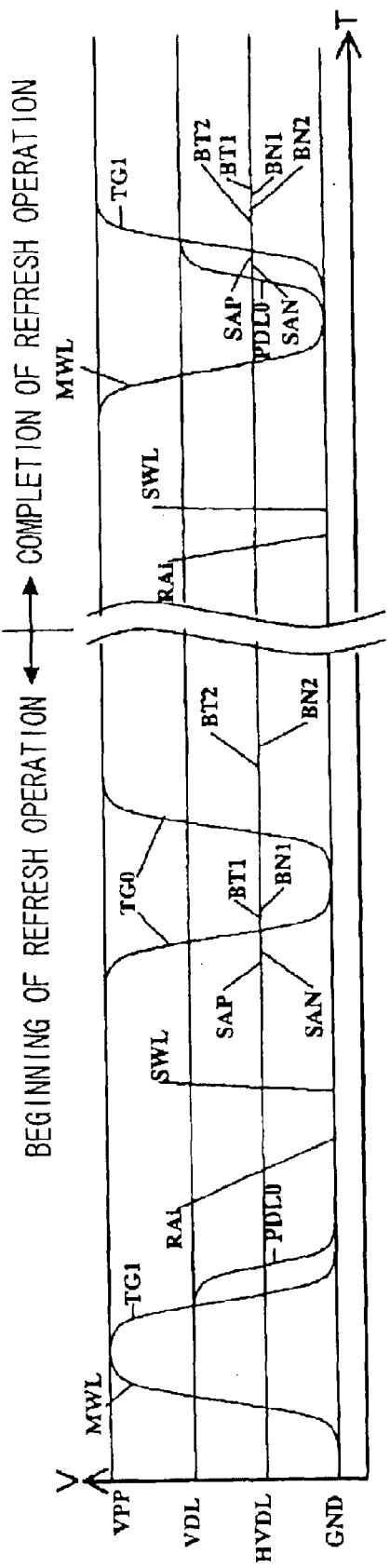
FIG. 8b EXAMPLE WHERE SAP↑ AND SAN↓ ARE ALSO STOPPED

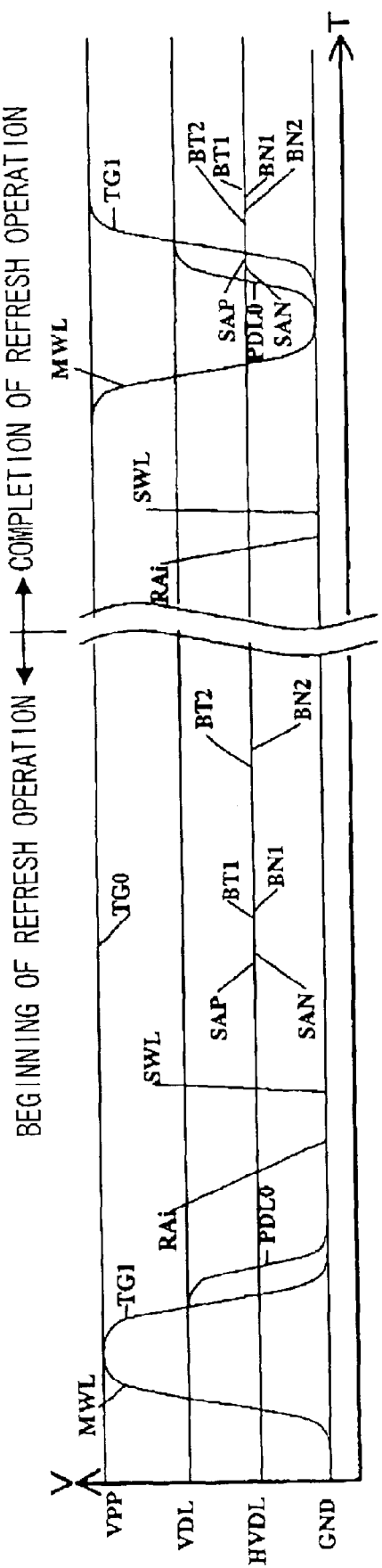
FIG. 9 WHEN TG0 ↓↑ IS STOPPED WITH ABSENCE OF WRITE HISTORY

WHEN PDL0↓ IS STOPPED WITH ABSENCE OF WRITE HISTORY

DYNAMIC SEMICONDUCTOR MEMORY DEVICE AND METHOD OF CONTROLLING REFRESH THEREOF

FIELD OF THE INVENTION

The present invention relates to a dynamic semiconductor memory device and the method of controlling refresh of the dynamic semiconductor memory device. More specifically, the invention relates to a technique for reducing refresh current for the dynamic semiconductor memory device.

BACKGROUND OF THE INVENTION

In dynamic type-semiconductor memory devices, in order to hold data in a memory cell, there is a need to perform a refresh operation for each given period. If refresh operation is performed for memory cells in a memory cell array at a row address, for which no write operation is generated and to which no access request other than the one for refresh has not been made, the refresh operation leads to unnecessary waste of power consumption.

Among publications about the dynamic random access memory (DRAM) device for preventing such unnecessary waste of power consumption caused by the refresh operation, for reference, is JP Patent Kokai JP-P2000-113667A, for example. The above-mentioned JP Patent Kokai JP-P2000-113667A discloses a configuration in which a row register unit for a row address is provided so as to record a write operation access history, as shown in FIGS. 12 and 13, thereby canceling a refresh operation on a row address on which no write operation is executed. With this configuration, the waste of power consumption caused by the refresh operation is avoided. Referring to FIG. 12, reference numeral 1201 designates an access request unit, reference numeral 1202 designates a refresh operation generating unit, reference numeral 1203 designates a refresh counting unit, and reference numeral 1204 designates a row address buffer unit, reference numeral 1205 designates a row decoder unit, reference numeral 1206 designates the row register unit, and reference numeral 1207 designates a memory array. The access request unit 1201 receives a refresh command, a WRITE command, and a READ command when they are generated, notifies the refresh operation generating unit 1202 and the row address buffer unit 1204 of the refresh command, and notifies the row address buffer unit 1204 of the WRITE command through a line L5 and the row register unit 1206 through a line L1 of the WRITE command. The refresh operation generating unit 1202 generates the refresh operation at a time interval necessary for execution of the refresh operation so as to hold internal data in a DRAM, and notifies the refresh counting unit 1203 and the row address buffer unit 1204 of the refresh operation. The refresh counting unit 1203 stores an initial row address value for refreshing the DRAM. When a refresh request is notified, the refresh counting unit 1203 counts up the row address. When the DRAM is refreshed, the row buffer 1204 selects a row address generated by the refresh counting unit, and when the DRAM is not refreshed, the row buffer 1204 selects an external row address supplied through a line L4, and notifies the row decoder unit 1205 of the row address. The row decoder unit 1205 decodes the row address so that it is associated with a word line in the array in the DRAM, and notifies the row register unit 1206 of the decoded address, through a signal L2.

FIG. 13 is a diagram showing a configuration of the row register unit 1206 illustrated in FIG. 12. Referring to FIG. 13, reference numeral 1210 denotes a latch circuit, reference numeral 1220 denotes an AND circuit, reference numeral 1230 denotes a latch circuit data input unit, reference numeral 1240 denotes a latch circuit data output unit, and reference numeral 1250 denotes a latch circuit control signal input unit. Referring to FIGS. 12 and 13, the device described in the above-mentioned publication includes the row register unit 1206 between the row decoder unit 1205 and the memory array 1207. When a write request is made and then a write history is held at the latch circuit 1210, a logic value "1" is recorded in the latch circuit 1210. When a refresh request is made, the internal status of the latch circuit 1210 is checked. When the status indicates a logic value "0", refresh on a row address is canceled. In other words, the output L2 of the row decoder 1205 and an output of the latch circuit 1210 are ANDed at the AND circuit 1220 of the row register unit 1206, and then a resulting output L3 is supplied to the memory array 1207.

SUMMARY OF THE DISCLOSURE

In the device described in the above-mentioned publication and explained with reference to FIGS. 12 and 13, word lines to the memory array (memory cell array) 1207 are supplied from the row register unit 1206 for recording a write operation access history. For this reason, a delay in selection of a word line for a write or read operation during normal operation is increased.

Furthermore, in the device described in the above-mentioned publication, when a write history is not recorded in the latch circuit 1210, the output of the AND circuit 1220 is at a low level, irrespective of the value of the signal L2, so that a word line from the row decoder unit 1205 to the memory array 1207 is held in an inactivated state. A refresh operation is thereby canceled. According to the inventor of the present invention, the device configured as described above lacks consideration to and a scheme for a reduction in current dissipation when a sense amplifier is operated for the refresh operation. In the configuration of a large-storage memory device in recent years, the effect of a sufficient reduction in refresh current cannot be expected.

Accordingly, it is an object of the present invention to provide a dynamic semiconductor memory device that remarkably reduces refresh current and the method of controlling refresh of the device.

The above and other objects are attained by the present invention that provides means for reducing refresh current through inactivation of a word line and/or inactivation of a sensing operation when no write history is present. A dynamic semiconductor memory device in accordance with one aspect of the present invention includes:

a latch circuit for storing and holding either presence or the absence of a write history on a word line, based on the word line supplied from a row decoder to a memory cell array and the value of a write command signal for commanding write operation; and a control circuit for exercising control so that a refresh operation is performed when a refresh command signal on the word line is activated and the output of the latch circuit indicates a value representative of the presence of the write history, and exercising control so that when the output of the latch circuit indicates a value representative of the absence of the write history, activation of the word line is stopped and/or a sensing operation is stopped, thereby stopping the refresh operation.

A dynamic semiconductor memory device in accordance with another aspect of the present invention includes:

a latch circuit for receiving a word line supplied from a row decoder to a memory cell array and a write command signal for commanding write operation to store and hold a value representative of the presence of a write history when the word line and the write command signal are activated; and a control circuit for receiving the held output of said latch circuit, the word line, and a refresh command signal for commanding a refresh operation on the word line, to exercise control so that, when the word line and the refresh command signal are activated and the output of the latch circuit indicates the value representative of the presence of the write history, a normal refresh operation is performed, and to exercise control so that, when the output of the latch circuit indicates a value representative of the absence of the write history, at least one of control signals for controlling a sensing operation by a sense amplifier is inactivated, thereby stopping the refresh operation on the word line.

The control circuit according to the present invention includes a circuit for exercising control for stopping activation of a sense amplifier drive signal supplied for driving the sense amplifier, when the word line and the refresh command signal are activated and the output of the latch circuit indicates the value representative of the absence of the write history. With this control, about a half of refresh current can be reduced.

A dynamic semiconductor memory device in accordance with a further aspect of the present invention, which includes a memory cell array with a plurality of memory cells arranged in an array form, having a hierarchical word line structure in which one main word line comprises a plurality of sub-words, comprises:

a latch circuit for holding a write history associated with each of units divided by the main word line, the plurality of memory cells connected to respective ones of the plurality of sub-word lines associated with the main word line being defined as a unit (also referred to as "a division unit"); and a control circuit for controlling whether to activate or inactivate a signal for controlling a sensing operation of a sense amplifier according to information on the write history latched by the latch circuit when a command to refresh a memory cell in one of the units is issued, thereby controlling whether to execute a refresh operation or not.

A method of controlling refresh of a dynamic semiconductor memory device according to still other aspect of the present invention comprises the following steps of:

storing and holding a value representative of the presence of a write history in a latch circuit when a word line supplied from a row decoder to a memory cell array and a write command signal for commanding write operation are activated;

exercising control so that a normal refresh operation is performed when the word line and a refresh command signal for commanding a refresh operation on the word line are activated, and the output of the latch circuit indicates the value representative of the presence of the write history; and a third step of exercising control so that when the word line and the refresh command signal for commanding the refresh operation on the word line are activated and the output of the latch circuit indicates a value representative of the absence of the write history, at least one of control signals for controlling a sensing operation by a sense amplifier is inactivated to stop the refresh operation on the word line, thereby reducing more refresh current than during the normal refresh operation.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRWINGS

FIG. 8 is a waveform diagram illustrating signal waveforms at the time of inhibiting the refresh operation according to a second embodiment of the present invention;

FIG. 9 is a waveform diagram illustrating signal waveforms at the time of inhibiting the refresh operation according to a third embodiment of the present invention;

PREFERRED EMBODIMENTS OF THE INVENTION

Figure 1:
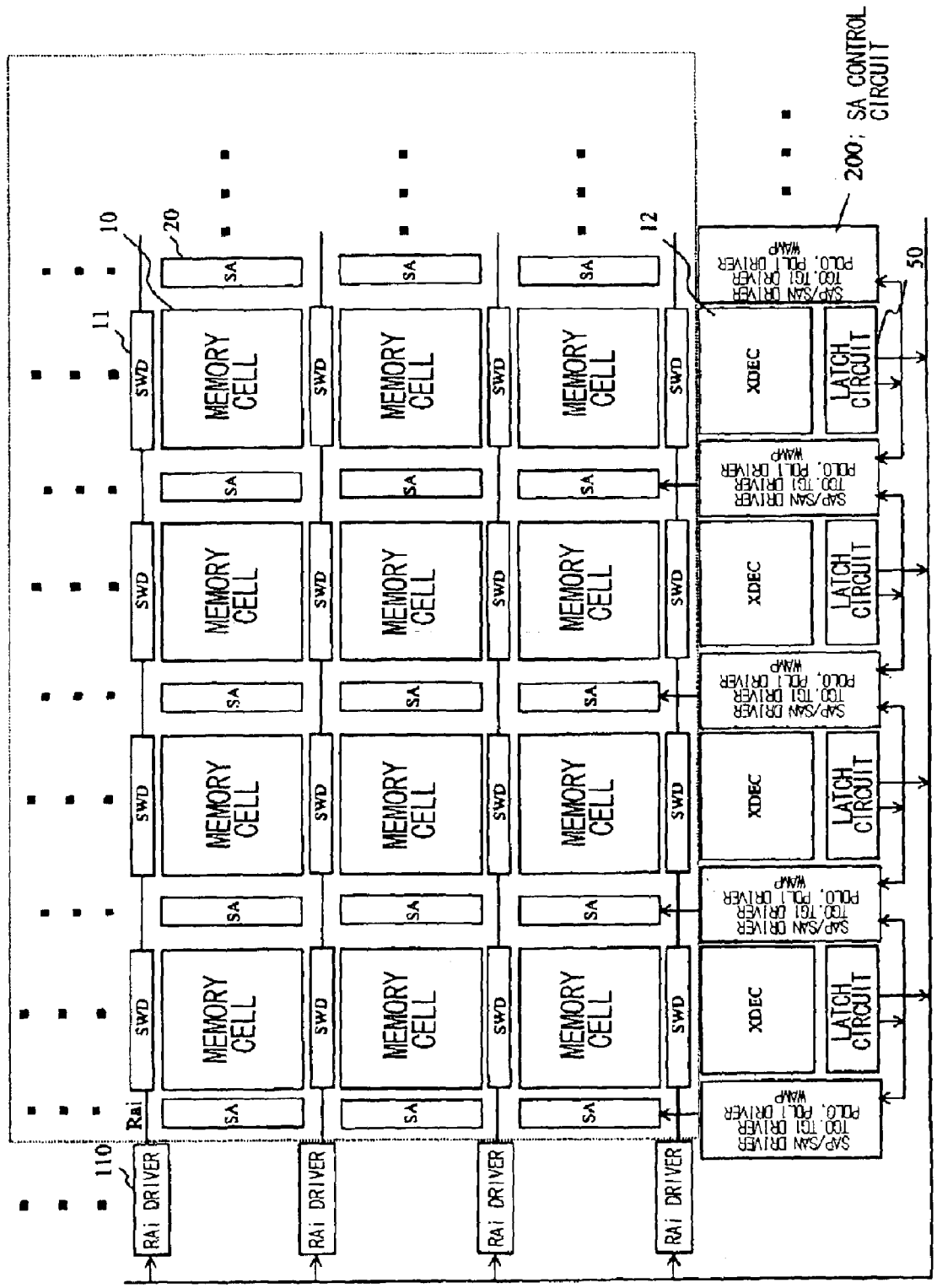
FIG. 1 is a diagram for explaining a configuration of a dynamic semiconductor memory device according to an embodiment of the present invention.
Figure 4:
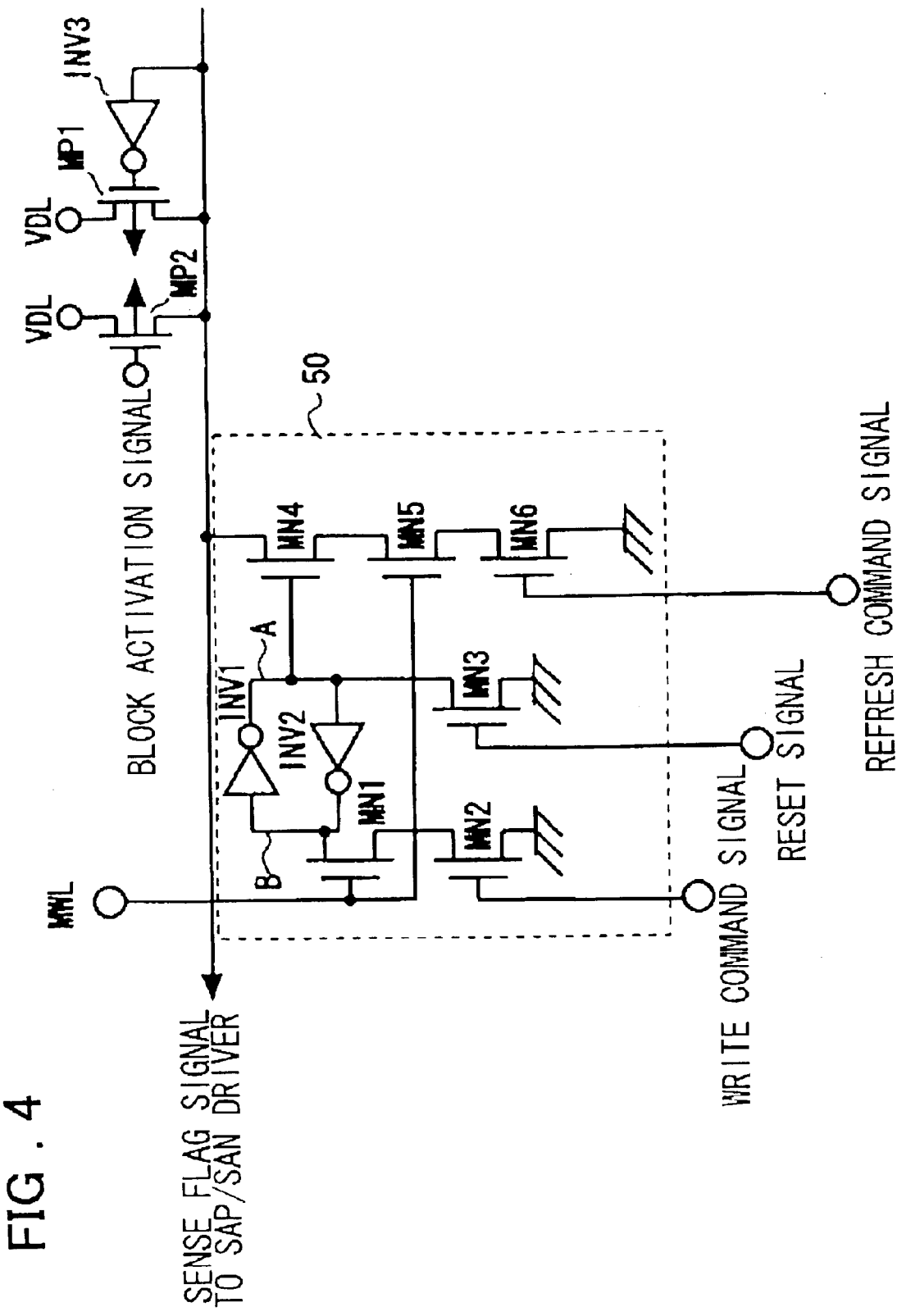
FIG. 4 is a diagram showing a configuration of each of the latch circuits in the dynamic semiconductor memory device according to the embodiment of the present invention.

Preferred embodiments of the present invention are described in the bellow. Referring to FIGS. 1 and 4, a dynamic semiconductor memory device in accordance with an embodiment of the present invention includes a latch circuit (a flip-flop composed by inverters INV1 and INV2 in FIG. 4) and a control circuit (MN4 to MN6 in FIG. 4, and sense amplifier control circuit 200 or RAi driver 110). The latch circuit receives a word line which is supplied from a row decoder (XDEC) (12) to a memory cell array (10) and a write command signal for commanding write operation. When the input word line and the input write command signal are activated, the latch circuit stores and holds a value representing the presence of a write history. The control circuit receives the latched output of the latch circuit, the word line, and a refresh command signal commanding a refresh operation associated with the word line. When the word line and the refresh command signal are activated for refresh, and the output of the latch circuit indicates the value representing the presence of the write history, the control circuit performs control so that a normal refresh operation is performed. On the other hand, when the output of the latch circuit indicates a value representing the absence of the write history, the control circuit performs control so that at least one of control signals for controlling the sensing operation of a sense amplifier is inactivated, thereby stopping the refresh operation associated with the word line.

Figure 2:
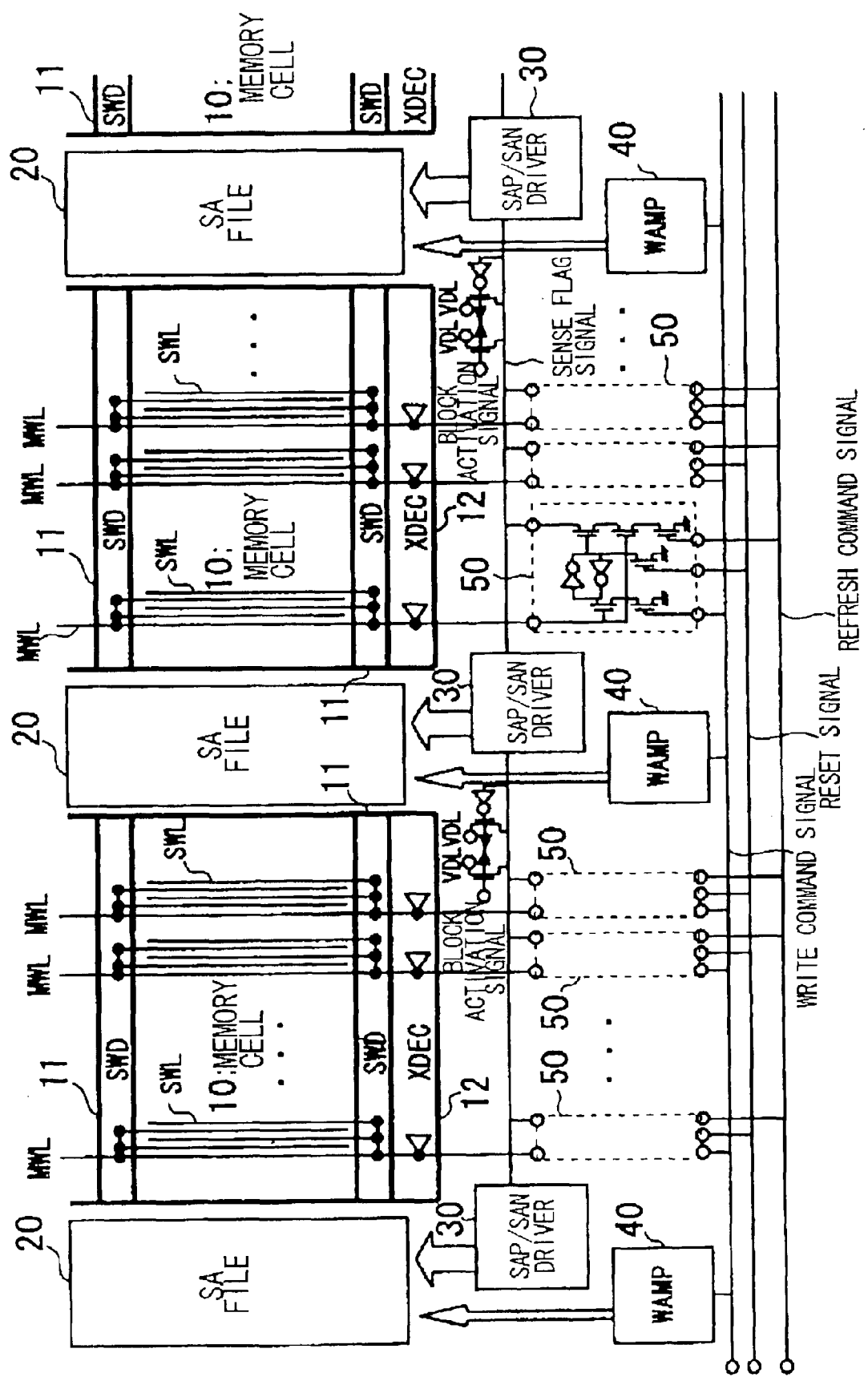
FIG. 2 is a diagram illustrating memory cells and latch circuits in the semiconductor memory device according to the embodiment of the present invention.
Figure 3:
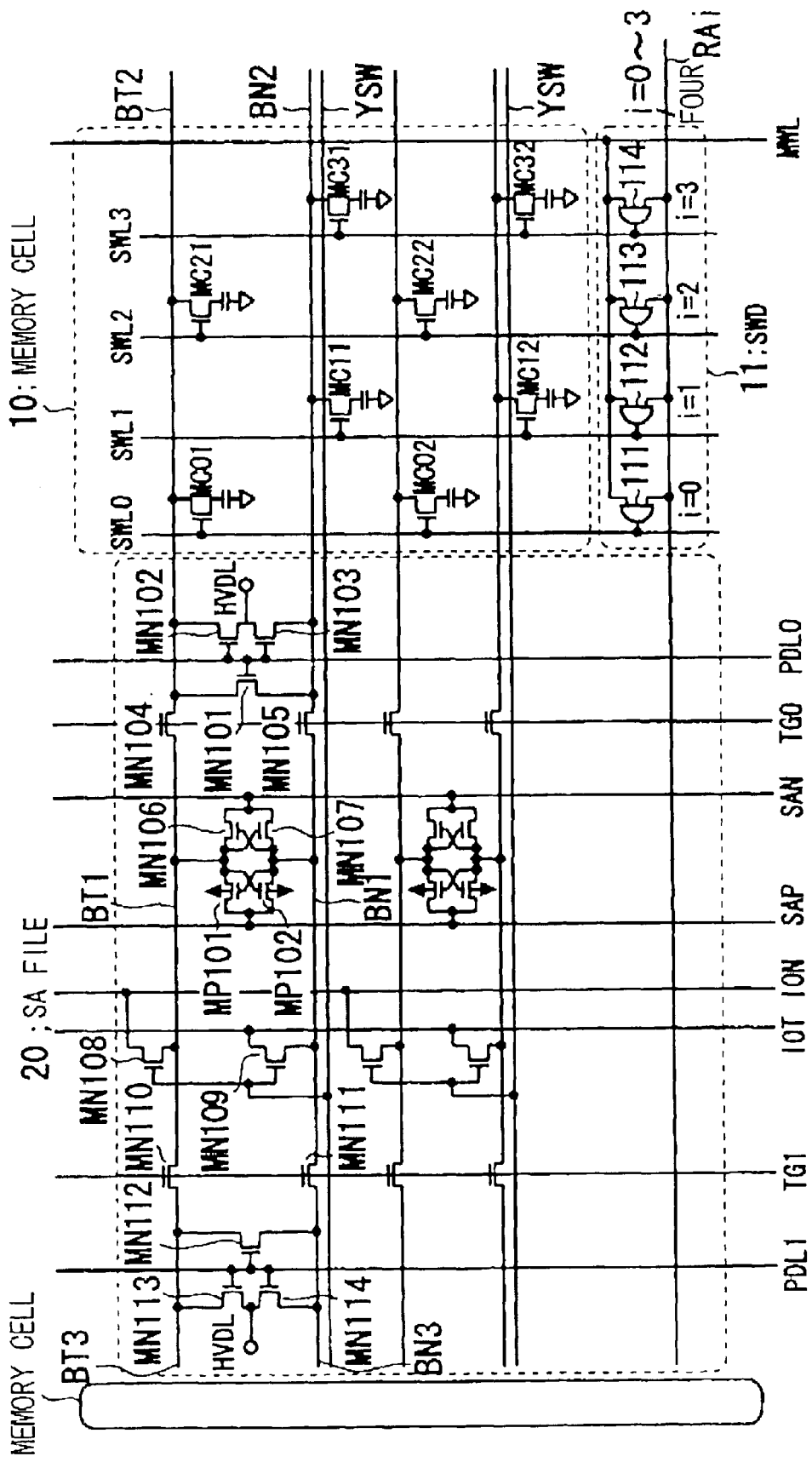
FIG. 3 is a diagram illustrating memory cells and sense amplifiers in the dynamic semiconductor memory device according to the embodiment of the present invention.

Referring to FIGS. 2 and 3, for example, the dynamic semiconductor memory device according to the embodiment of the present invention, is comprised of a hierarchical word line structure in which one main word line (MWL) supplied from the row decoder (XDEC) (12) has a plurality of sub-word lines. A latch circuit 50 for holding a write history is disposed for each main word line MWL.

More specifically, the dynamic semiconductor memory device includes a plurality of latch circuits (50), each holding write history associated with each of division units (section) which are divided by main word lines (MWL). A main word line (MWL), the write command signal, the refresh command signal, and a reset signal are supplied to a latch circuit (50). When a refresh command is issued for memory cell within one of units, the sense amplifier control circuit (indicated by reference numeral 200 in FIG. 1) controls activation and inactivation of a signal for controlling the sensing operation of an associated sense amplifier (20) based on the write history information held by the latch circuit 50, thereby controlling whether to execute the refresh operation. In other words, when the refresh command (self-refresh or a CBR (CAS before RAS)) are supplied and then the command to refresh the memory cells within a division unit is asserted, the refresh operation is normally performed on the memory cell within the division unit in case the presence of write history is stored in the latch circuit (50). In case the absence of the write history is stored in the latch circuit (50), the refresh operation on the memory cell of the associated division unit is not performed.

According to one aspect of the embodiment of the present invention, in order to stop the refresh operation on the memory cells of the division unit, control such as canceling activation of a sense amplifier drive signal SAP/SAN for providing a power supply to the sense amplifier, activation of a main word line, or canceling activation of a sub-word line is performed. More specifically, when a word line and the refresh command signal are activated, and the latch circuit (50) stores the value representing the absence of the write history, control is performed so that output of the sense amplifier drive signal SAP/SAN supplied from a SAP/SAN driver as a power supply to the sense amplifier (20) is stopped. Control for stopping output of the sense amplifier drive signal SAP/SAN is performed, about a half of refresh current is reduced compared with the case where the control according to the present invention is not performed.

In accordance with another embodiment of the present invention, when the latch circuit (50) stores and holds the value representing the absence of the write history at the time of the refresh operation, control is preformed so that a RAi driver (110) which outputs a control signal (RAi) for selecting a sub-word line holds the signal RAi in an inactivate state and an activated sub-word line is not supplied from a sub-word line drive circuit (SWD) (11).

Alternatively, in accordance with still another embodiment of the present invention, when the latch circuit (50) stores and holds the value representing the absence of the write history at the time of the refresh operation, control is performed so that a precharge control signal PDL supplied from a PDL driver for outputting a control signal to a circuit that performs control of precharge and equalization of bit lines is kept activated, and the bit line is held at a precharge potential even at the time of the sensing operation for refresh.

Alternatively, in accordance with a further embodiment of the present invention, when the latch circuit (50) stores and holds the value representing the absence of a write history at the time of the refresh operation, a transfer gate control signal generation circuit (TG driver) is controlled so that a transfer gate inserted between a bit line connected to a memory cell and the sense amplifier is kept in an on-state.

In the embodiment of the present invention, part or a combination of all the control for stopping the refresh operation can be performed.

Figure 12:
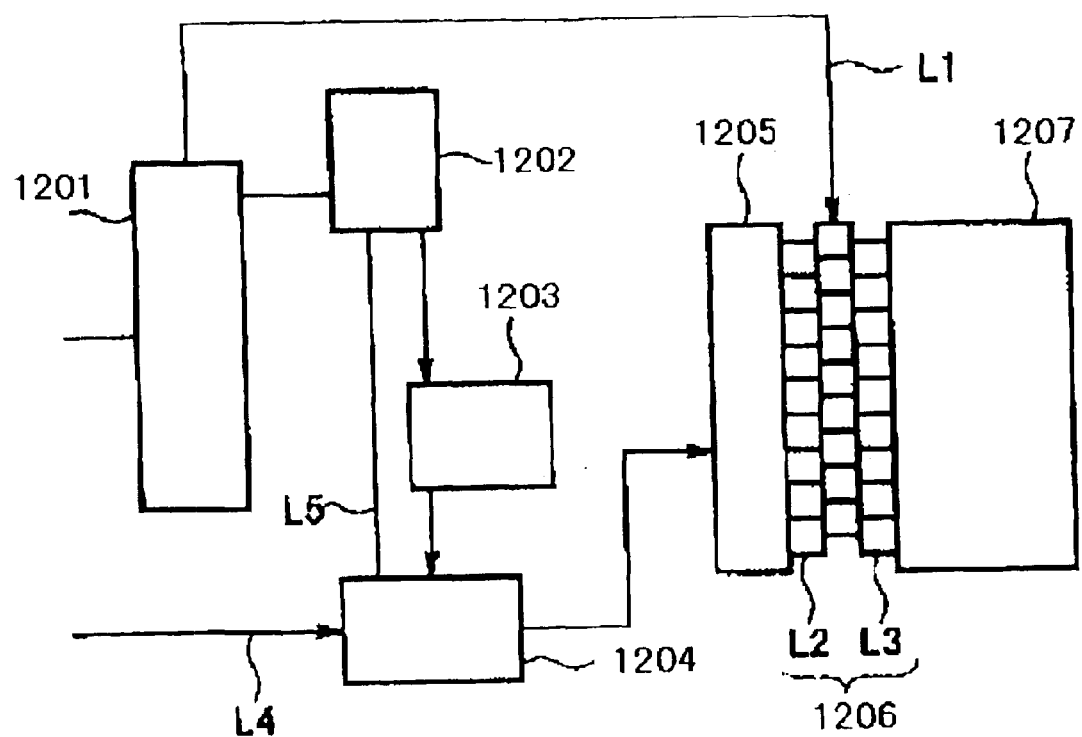
FIG. 12 is a diagram illustrating a configuration of a conventional DRAM device for performing refresh current control.
Figure 13:
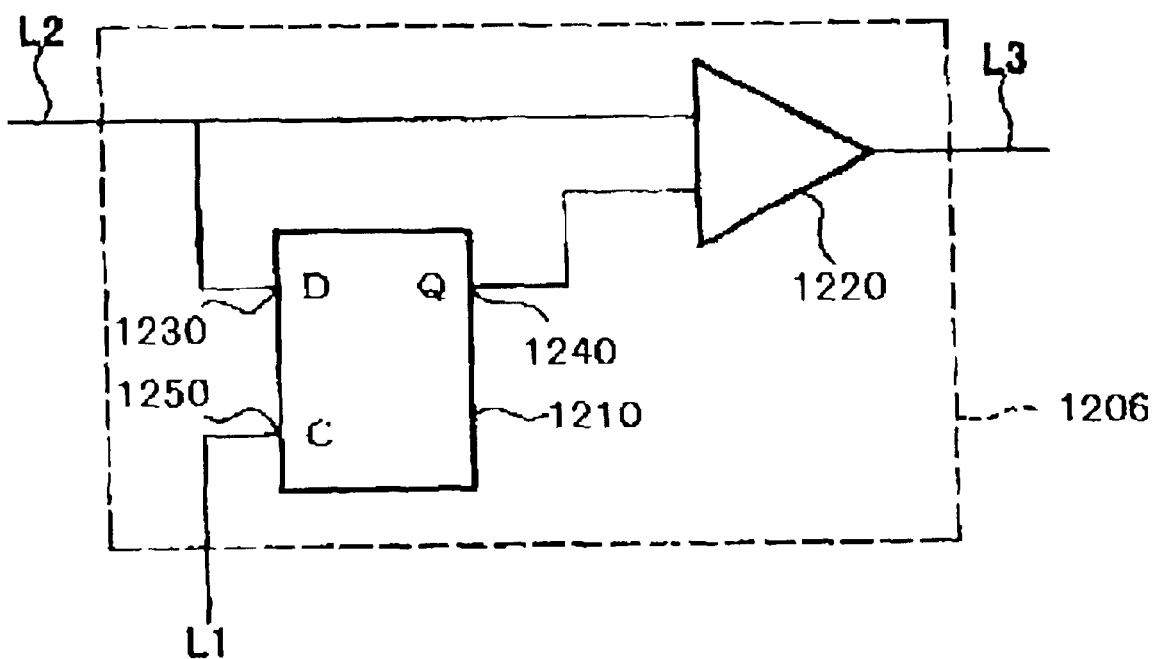
FIG. 13 is a diagram illustrating a configuration of a row register unit in the conventional DRAM device.

In accordance with another embodiment of the present invention, it is preferable that the latch circuit (50) is configured as described below. That is, as shown in FIG. 4, the latch circuit (50) includes a flip-flop configured by cross-connecting inputs and outputs of two inverters (INV1 and INV2), first and second switching elements (MN1 and MN2), a third switching element (MN3), a fourth switching element (MN4), a fifth switching element (MN5), and a sixth switching element (MN6). The first and second switching elements are connected in series between an input node (B) of the flip-flop and a first power supply (GND), have at control terminals for receiving respectively a word line (a main word line for the hierarchical word line structure, being supplied from the row decoder to the memory cell array) and the write command signal for commanding write operation and are controlled to turn on and off. The third switching element is inserted between an output node (A) of the flip-flop and the first power supply (GND), has a control terminal for receiving a reset signal, and is then controlled to turn on and off. The fourth switching element has a control terminal connected to the output node (A) of the flip-flop and controlled to turn on and off. The fifth switching element (MN5) has a control terminal for receiving the main word line, and then is controlled to turn on and off. The sixth switching element has a control terminal for receiving the refresh command signal for commanding the refresh operation associated with the word line, and is then controlled to turn on and the off. The fourth to sixth switching elements (MN4 to MN6) are connected in series between the output signal (a sense flag signal) of the latch circuit (50) and the first power supply (GND). The refresh command signal to be input to the latch circuit (50) is generated by a well-known circuit. In other words, the refresh command signal is supplied from the refresh operation generating unit described with reference to FIG. 12 upon reception of the refresh command, and the output of the row decoder with a row address input thereto, supplied from the refresh counter unit in FIG. 12 is employed in the form of the word line (main word line) to be refreshed.

The output signal (sense flag signal) of the latch circuit (50) is precharged to a potential indicating the inactive state when an associated block is not selected (a block activation signal for the block connected to a word line is at a low level). When write operation has not been performed onto a word line (a main word line), the output node (A) of the flip-flop retains a first logic value. When write operation is performed onto the word line (main word line), the input node (B) of the flip-flop is set to the first logic value, while the output node (A) of the flip-flop is set to a second logic value.

When the refresh command is asserted, the refresh command signal is activated, and then the word line (main word line) is selected, the output signal (sense flag signal) of the latch circuit (50) is kept in the inactive state if the output node of the flip-flop assumes the first logic value. If the output node of the flip-flop assumes the second logic value, the output signal (sense flag signal) of the latch circuit (50) is activated.

Figure 5:
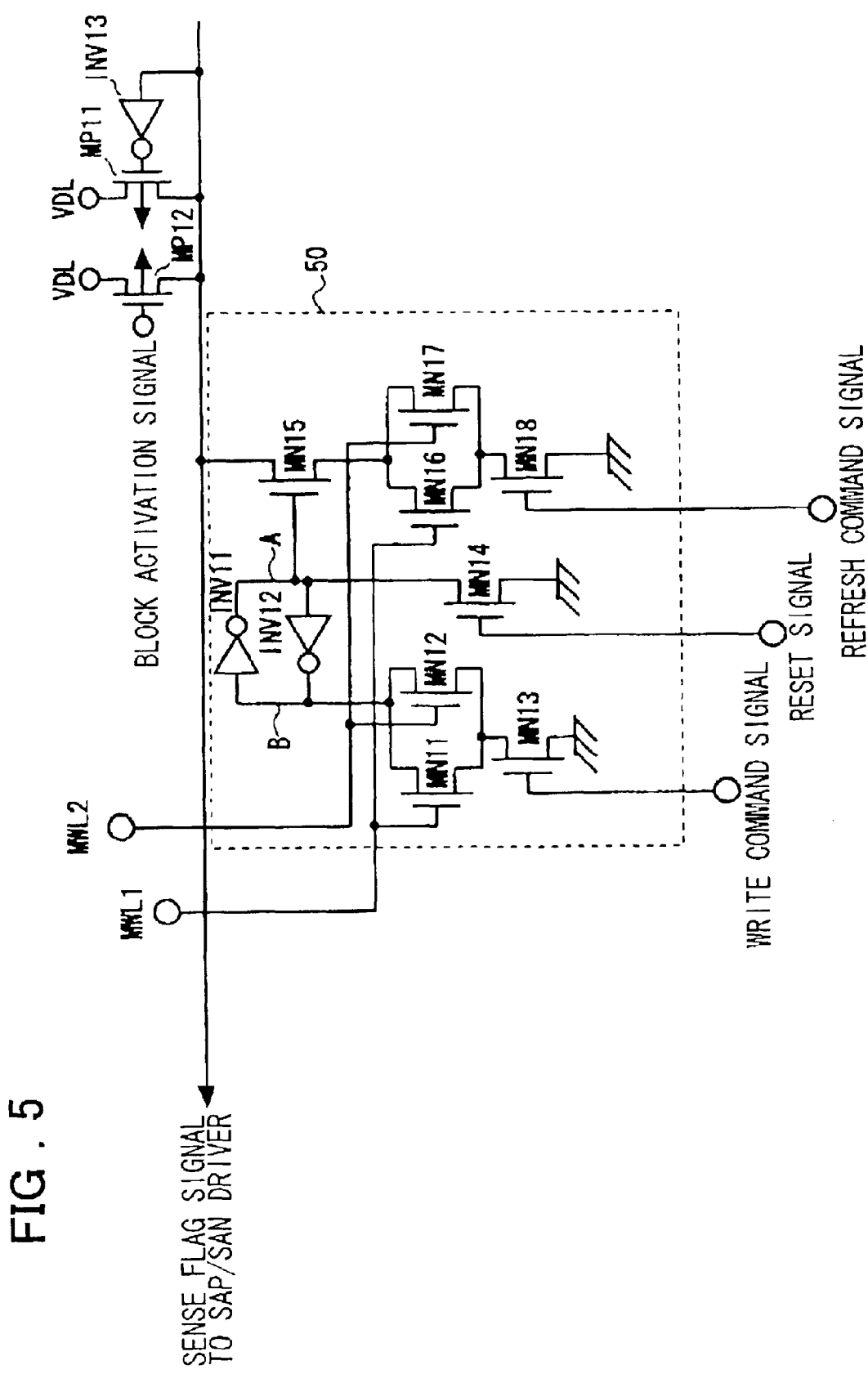
FIG. 5 is a diagram showing other configuration of the latch circuit in the dynamic semiconductor memory device according to the present invention.

As shown FIG. 5 that illustrates another configuration of the latch circuit (50) according to the embodiment of the present invention, a plurality of first switching elements (MN11 and MN12) can be disposed in parallel between the input node of the flip-flop and a second switching element, and a plurality of fifth switching elements (MN16 and MN17) may be disposed in parallel between a fourth switching element and a sixth switching element. The control terminals of the first switching elements, the number of which is equivalent to the number of a plurality of word lines, receive the word lines, and are then controlled to turn on and off. The control terminals of the fifth switching elements, the number of which is equivalent to the number of the word lines, receive the word lines, and are controlled to turn on and off.

In this manner, the dynamic semiconductor memory device according to the embodiment mode of the present invention controls whether to execute the refresh operation on a memory cell for each division unit. When write operation is not performed onto a memory cell division unit, the refresh operation is not performed thereon. Thus, in an application where an overall memory space is not employed (an unused memory region is present), refresh current can be reduced. In the dynamic semiconductor memory device according to the embodiment mode of the present invention, a word line from a row decoder is connected to a memory array, just as it is, so that a delay in selecting the word line at the time of write and read operations will not occur.

The embodiment of the present invention will be described in detail with reference to drawings. FIG. 1 is a block diagram showing a principle part of a dynamic memory according to an embodiment of the present invention, which shows a configuration of a synchronous DRAM. As is well known, a synchronous DRAM includes a command decoder for decoding an input command, a mode register for storing an operation mode, an I/O data buffer/register connected to a data I/O terminal DQ, and an address buffer/register connected to an address signal terminal. These components are omitted in FIG. 1.

Referring to FIG. 1, the dynamic semiconductor memory device according to this embodiment includes a plurality of memory cell arrays 10, each having a plurality of memory cells arranged in an array, a plurality of sub-word line driving circuits (SWD) 11, a plurality of row decoders (XDEC) 12, and a plurality of sense amplifiers (SA) 20. The dynamic semiconductor memory device further includes a plurality of sense amplifier control circuits 200, each for controlling a sensing operation for the corresponding sense amplifier (SA) file (column) 20, a plurality of RAi drivers 110, each of which is common to a plurality of the sub-word line driving circuits (SWD) II arranged in one row, and a plurality of X decoders (XDEC) 12 each for a plurality of memory arrays 10 arranged in one column. The RAi driver 110 supplies a sub-word selection signal Rai (also referred to as a "sub-word power line") to the corresponding sub-word line driving circuits (SWD) 11.

In this embodiment, the dynamic semiconductor memory device includes a latch circuit 50 for a plurality of the memory arrays 10 arranged in one column. As will be described later, the latch circuit 50 includes one flip-flop for storing write history for a plurality of sub-word lines SWL associated with each of one or a plurality of main word lines MWL.

A sense amplifier control circuit 200 includes a SAP/SAN driver for driving and outputting a sense amplifier drive signal SAP/SAN, a TG0, TG1 driver for respectively generating one-shot transfer gate control signals TG0 and TG1 for controlling on and off of a transfer gate inserted between a sense amplifier and a bit line for a memory cell, a PLD0, PLD1 driver for supplying precharge control signals PDL0 and PDL1 for controlling precharge of the bit line, and a write amplifier (WAMP) for writing data in the memory cell.

As shown in FIG. 1, the latch circuits 50 were introduced for the first time, according to the present invention. When it is found that there is no write history based on the output of the latch circuit 50 and then a refresh command signal is activated, the sensing operation of a sense amplifier (SA) group 20 is controlled, so that a refresh operation is stopped.

In an example illustrated in FIG. 1, the output of a latch circuit 50 is supplied to a sense amplifier control circuit 200 and also supplied to a RAi driver 110. Based on a write history stored in the latch circuit 50, when the refresh operation is performed, control over the operation of the sense amplifier control circuit 200 and/or the operation of the RAi driver 110 is executed.

FIG. 2 illustrates part of the configuration the memory cell array shown in FIG. 1 in the form of a block diagram. As the sense amplifier control circuits 200 illustrated in FIG. 1, the SAP/SAN drivers 30 for driving the sensing drive signal and the write amplifiers (WAMPs) 40 are illustrated in FIG. 2 for simplicity.

Referring to FIG. 2, in this embodiment, a main word line MWL output from each row decoder (XDEC) 12 to each memory array 10 is supplied to each of the latch circuits 50. A write command signal, a reset signal, and a refresh command signal be also supplied to each of the latch circuits 50. The outputs of the latch circuits 50 are connected to a sense flag signal in common. The activation and inactivation of a SAP/SAN driver 30 are controlled, based on write history information held in the flip-flop of a latch circuit 50. The sense flag signal fed to the SAP/SAN drivers 30 is a signal for activating a block connected to a word line, generated according to the row address of the block, and is provided for each block which is selected by a block activation signal of a word line system.

In case the flip-flop of a latch circuit 50 stores the presence of the write history, the latch circuit 50 inactivates the sense flag signal by forcing the sense flag signal to the ground level, when the refresh command signal is activated. The sense flag signal is supplied to a SAP/SAN driver 30. When the received sense flag signal is in the inactive state, the SAP/SAN driver 30 keeps the sense amplifier drive signal SAP/SAN in the inactive state. Thus, no drive power is supplied to the associated sense amplifier.

The write command signal (write enable signal) is supplied to a write amplifier (WAMP) 40. When the write command signal is activated, the write amplifier (WAMP) 40 receives data which is entered from the data input terminal (DQ) not shown and supplied from the I/O buffer/register that receives signal from the DQ terminal, and then, drives and delivers the data as complementary signals onto I/O lines (IOT and ION in FIG. 3).

The refresh signal is asserted in response to a refresh request such as CBR (CAS before RAS) or self-refresh.

FIG. 3 is a diagram showing a configuration of the memory cell arrays 10, a sense amplifier (SA) file 20, and a sub-word line driving circuit (SWD) It illustrated in FIG. 1 and FIG. 2. A memory array 10 includes a plurality of complementary bit line pair BT2 and BN2, and a plurality of memory cells MC. The memory cells MC includes a memory cell transistor that has a gate coupled to the sub-word line SWL supplied from the sub-word line driving circuit (SWD) 11, a drain coupled to a bit line, and a source coupled to a capacitance (storage capacitance).

The sub-word line driving circuit (SWD) 11 includes AND circuits 111 to 114 that executes logical AND operation of each of RAi signals (four Rai signals in the drawing) supplied from a RAi driver and the input of a main word-line MWL. The outputs of the AND circuits 111 to 114 are coupled to associated sub-word lines SWL0 to SWL3 in the memory cell array. When the main word-line MWL is selected and goes at a high level, a sub-word line coupled to the output of the AND circuit 111, 112, 113, or 114 associated with the high level Rai signal goes to a high level. A memory cell coupled to the sub-word line is selected.

N-channel MOS transistors MN102 and MN103, and an N-channel MOS transistor MN101 compose a precharge circuit and an equalizing circuit, respectively. The N-channel MOS transistors MN102 and MN103 are inserted between the pair of bit lines BT2 and BN2 in series and have gates for receiving a precharge control signal PDL0 in common. The drain and the source of the N-channel MOS transistor MN101 are respectively connected to the pair of bit lines BT2 and BN2, and the precharge control signal PDL0 is supplied to the gate of the N-channel MOS transistor MN101. The source of the MOS transistor MN102 is coupled to the drain of the MOS transistor MN103, and they are connected to a precharge voltage HVDL. The HVDL is a supply voltage that is half the level of an internal supply voltage VDL supplied to a SAP driver.

When the precharge control signal PDL0 is at a high level, the MOS transistors MN102 and MN103 are switched on, and the pair of bit lines BT2 and BN2 are precharged to the HVDL and is balanced through the MOS transistor MN101. When the precharge control signal PDL0 is at a low level, the MOS transistors MN101 to MN103 are switched off, so that the pair of the bits lines BT2 and BN2 are electrically isolated.

A MOS transistor MN104 connected between the bit line BT2 of the bit line pair in the memory cell array and a bit line BT1 of the bit line pair in a sense amplifier and a MOS transistor MN105 connected between the bit line BN2 of the bit line pair in the memory cell array and a bit line BN1 of the bit line pair in the sense amplifier are composed by transfer gates. When the transfer gate control signal TG0 supplied to the respective gates is at a high level, they are brought into conduction (switched on). When the transfer gate control signal TG0 is at a low level, they are switched off. The transfer gate control signal TG0 consists of a pulse signal supplied from a TG0 driver (refer to FIG. 1), which is delayed by a predetermined period of time from a sensing operation start point and is at a LOW level for a predetermined period of time.

The sense amplifier 20 is configured as a differential structure that includes two inverters, of which respective outputs and inputs are cross connected and their connection nodes are connected to the complementary pair of the bit lines BT1 and BN1. More specifically, the sense amplifier 20 includes P-channel MOS transistors MP101 and MP102 which have sources coupled to the sense amplifier drive signal SAP that provides a higher level power supply voltage, and N-channel MOS transistors MN106 and MN107 which have sources coupled to the sense amplifier drive signal SAN that provides a lower level power supply voltage. The MOS transistors MP101 and MP102 have drains coupled to the drains of the MOS transistors MN106 and MN107, respectively, and also connected to the pair of the bit lines BT1 and BN1, respectively. The drains of MOS transistors MP101 and MP102 are cross-coupled to the gates of the MOS transistors MP102 and MP101, respectively, and the drains of the MOS transistors MN106 and MN107 are cross-coupled to the gates of the MOS transistors MN107 and MN106, respectively.

An N-channel MOS transistor MN108 is inserted between the bit line BT1 of the bit line pair of BT1 and BN1 and an IO line ION of the IO line pair of IOT and ION, and an N-channel MOS transistor MN 109 is inserted between the bit line BN1 of the bit line pair of BT1 and BN1 and an IO line IOT of the IO line pair of IOT and ION. The N-channel MOS transistors MN108 and MN109 have gates connected to a column selection signal YSW. When the column selection signal YSW is at a high level, the MOS transistors MN108 and MN109 are switched ON, thereby establishing an electrical connection between the pair of the bit lines BT1 and BN1 and an electrical connection between the pair of the IO lines IOT and ION.

The pair of the bit lines BT1 and BN1 connected to the sense amplifier is coupled to a pair of the bit lines BT3 and BN3 on the opposite memory cell array side, respectively, through transfer gates of N-channel MOS transistors MN110 and MN111, the gates of which receive the transfer gate control signal TG1.

N-channel MOS transistors MN113 and MN114, and an N-channel MOS transistor MN112 constitute the precharge circuit and the equalizer (balancing) circuit, respectively. The MOS transistors MN113 and MN114 are connected between the pair of the bit lines BT3 and BN3, a connecting point between the source of the MOS transistor MN113 and the drain of the MOS transistor MN114 is coupled to the precharge voltage HVDL, and the gates of the MOS transistors MN113 and MN114 are coupled in common to the precharge control signal PDL1. The MOS transistor MN112 is connected between the pair of the bit lines BT3 and BN3, and the gate of the MOS transistor MN112 is coupled to the precharge control signal PDL1.

In the configuration shown in FIG. 3, the sense amplifier (SA) group 20 is disposed on both sides of the memory arrays 10, so that the sense amplifier is shared by the memory arrays on both sides thereof. The present invention is not, as a matter of course, limited to this configuration.

Next, the latch circuit employed in the embodiment of the present invention will be described. FIG. 4 is a diagram showing details of a circuit configuration of the latch circuit according to the embodiment of the present invention. Referring to FIG. 4, the latch circuit 50 includes two inverters INV1 and INV2, and N-channel MOS transistors MN1, MN2, MN3, MN4, MN5, and MN6. An input terminal of the inverter INV1 is coupled to an output terminal of the inverter INV2, while an output terminal of the inverter INV1 is coupled to an input terminal of the inverter INV2. A gate of the N-channel MOS transistor MN1 is coupled to the main word line MWL, and a drain of the N-channel MOS transistor MN1 is coupled to a connecting point between the input terminal of the inverter INV1 and the output terminal of the inverter INV2. T the N-channel MOS transistor MN2 has a drain coupled to the source of the N-channel MOS transistor MN1, and a source of the N-channel MOS transistor MN2 coupled to the ground, and a gate to which the write command signal is supplied. The N-channel MOS transistor MN3 has a drain coupled to a connecting point between the input node of the inverter INV2 and the output node of the inverter INV1, a source coupled to the ground, and a gate to which the reset signal is supplied. The N-channel MOS transistor MN4 has a drain coupled to the sense flag signal, and a gate coupled to a connecting point between the input node of the inverter INV2 and the output node of the inverter INV1. The N-channel MOS transistor MN5 has a drain coupled to a source of the N-channel MOS transistor MN4, and a gate connected to the main word line MWL. The N-channel MOS transistor MN6 has a drain connected to the source of the N-channel MOS transistor MN5, a source coupled to ground, and a gate to which the refresh command signal is supplied.

The latch circuit further includes P-channel MOS transistors MP1 and MP2 which have sources connected in common to the power supply VDL and the drains connected in common to the sense flag signal, and an inverter INV3 that receives the sense flag signal. A block activation signal is supplied to the gate of the P-channel MOS transistor MP2, while the output of the inverter INV3 is coupled to the gate of the P-channel MOS transistor MP1.

An operation of the latch circuit will be described with reference to FIG. 4. When the power is turned on, or in response to a reset request from the mode register (not shown), the reset signal (one-shot pulse) is input. When the reset signal goes to a high level, the MOS transistor MN3 is switched on, so that the flip-flop is reset. Then, its output node A goes to a low level, so that the flip-flop holds this reset state.

The block activation signal to be supplied to the gate of the P-channel MOS transistor MP2 is generated by a block selection signal generating circuit (not shown) based on the output of a row decoder. When a block associated with a word line of a memory array between the sense amplifier (SA) files is not selected, the block activation signal is driven at a low level. At this point, the P-channel MOS transistor MP2 is switched on, so that the sense flag signal is precharged to the power supply voltage VDL.

When write operation is performed, the main word line MWL supplied from the row decoder (indicated by reference numeral 12 in FIG. 1) to which an address to be written is input goes to a high level. The write command signal is thereby activated, and then rises to a high level.

When both of the main word line MWL and the write command signal go to a high level, both of the MOS transistors MN1 and MN2 of the latch circuit 50 are switched on. Then, an input node B (an input node to the flip-flop) of the inverter INV1 falls to a low level, while the output node A (the output node of the flip-flop) of the inverter INV1 rises to a high level. In other words, by write operation, the flip-flop of the latch circuit 50 is set, so that the output node A is kept to be at a high level.

The refresh command signal is activated to rise to a high level in response to the input of a refresh command or to self-refresh. Then, a row address for the refresh is specified by a refresh counter (not shown), for example, so that a main word line selected from among the main word lines from the row decoders (indicated by reference numeral 12 in FIG. 1) is driven High.

In the latch circuit 50 to which the main word line MWL for the refresh is supplied, when both of the main word line MWL and the refresh command signal go High and the output node A of the flip-flop of the latch circuit 50 is at a high level (when the write history is present), the MOS transistors MN4, MN5, and MN6 are all switched on. A sense flag signal line is short-circuited to the ground through the MOS transistors MN4 to MN6 that are in on-states, thereby falling to a low level.

The SAP/SAN driver 30 (refer to FIG. 2) connected to the sense flag signal line at a low level supplies the High/low level sense amplifier drive signal SAP/SAN (refer to FIG. 3) based on a signal controlling the start or end of the sensing operation. The signal for controlling the start and end of the sensing operation, supplied to the SAP/SAN driver (a sense amplifier activation signal) is generated by a sense amplifier activation signal generating circuit not shown.

When the output node A of the flip-flop of the latch circuit 50 is at a low level (no write history is present) and the main word line MWL and the refresh command signal are activated (go High), the potential of the sense flag signal line is kept in a high level, which is a precharge potential, or held in an inactivated state. It is because the N-channel MOS transistor MN4 is in an off-state. The SAP/SAN driver 30 (refer to FIG. 2) connected to the sense flag signal at the high level does not supply the High/low level sense amplifier drive signal SAP/SAN (refer to FIG. 3).

While the input sense flag signal is activated (in a low level), the SAP/SAN driver 30 (refer to FIG. 2) supplies the sense amplifier drive signal SAP/SAN at the VDL power supply voltage/GND potential during the sensing operation, based on the sense amplifier activation signal (not shown) for controlling the start and end of the sensing operation. On the other hand, when the sense flag signal is inactivated (in a high level), the SAP/SAN driver 30 (refer to FIG. 2) does not supply the sense amplifier drive signal SAP/SAN (refer to FIG. 3) at the VDL power supply potential/GND potential even when the sense amplifier activation signal is activated. The sense amplifier drive signal is held at the voltage HVDL, for example. In the configurations illustrated in FIG. 2 and FIG. 4, the sensing operation by a sense amplifier when data is read from a memory cell is executed as follows. When the block activation signal undertakes a transition from a low level to a high level and the sense flag signal precharged to the high level is isolated from the power supply VDL (or at the high level), the sense flag signal is activated to be driven to a low level through a switch not shown that is turned on in response to a read command signal. The sense amplifier drive signal SAP/SAN is thereby supplied to the sense amplifier, so that reading from a selected cell is performed.

FIG. 5 is a diagram showing a variation of the latch circuit according to the embodiment of the present invention. Referring to FIG. 5, two main word lines are supplied to the latch circuit 50. When write operation onto a memory cell in a unit associated with one of the two main word lines is performed, the latch circuit performs control so that the refresh operation is executed. When no write operation is performed onto the main word lines, the latch circuit performs control so that the sense amplifier drive signal is not supplied even if the refresh command signal for these main word lines is activated.

The latch circuit 50 includes two inverters INV1 and INV2, and N-channel MOS transistors MN11 to MN18. The input of the inverter INV1 is coupled to the output of the inverter INV2, while the output of the inverter INV1 is coupled to the input of the inverter INV2. The N-channel MOS transistors MN11 and MN12 have gate coupled to main word lines MWL1 and MWL2, respectively, drains connected in common to the input node B of the inverter INV1 and sources connected in common. The N-channel MOS transistor MN13 has a drain connected to the sources of the N-channel MOS transistors MN11 and MN12 connected in common, a source coupled to the ground, and a gate to which the write command signal is supplied. The N-channel MOS transistor MN14 has a drain connected to the output node A of the inverter INV1, a source coupled to the ground, and a gate to which the reset signal is supplied. The N-channel MOS transistor 15 has a drain coupled to the sending flag signal, a gate connected to the output node A of the inverter INV1. The N-channel MOS transistors MN16 and MN17 have drains connected in common to the source of the N-channel MOS transistor MN15, gates connected to the main word lines MWL1 and MWL2, respectively and sources connected in common. The N-channel MOS transistor MN18 has a drain connected to the sources of the N-channel MOS transistors MN16 and MN17, a gate to which the refresh command signal is supplied, and a source coupled to ground. Further, the latch circuit 15 further includes P-channel MOS transistors MP11 and MP12, and an inverter INV13. The block activation signal is supplied to the gate of the P-channel MOS transistor MP12 inserted between the power supply VDL and the sense flag signal. The P-channel MOS transistor MP11 is inserted between the power supply VDL and the sense flag signal. The inverter INV13 has an input terminal coupled to the sense flag signal and an output terminal coupled to the gate of the P-channel MOS transistor MP11.

An operation of the latch circuit will be described. When power is turned on or using the mode register or the like not shown, the one-shot pulse reset signal is supplied to the latch circuit, for example. When the reset signal rises to a high level, the MOS transistor MN14 is switched on, so that the flip-flop is reset. Then, the output node A of the flip-flop falls to a low level.

The block activation signal to be input to the gate of the MOS transistor MP12 is driven to a low level when a block belonging to a word line system, in a memory cell array between the sense amplifier columns has not been selected. When the block is selected, the block activation signal is driven High. When the block activation signal is Low, the MOS transistor MP 12 is switched on, and the sense flag signal is precharged to the power supply potential VDL.

An operation of the latch circuit 50 when write operation is performed will be described. In response to a request for write operation, the main word line MWL1 goes to a high level, so that the write command signal is activated to become to be at a high level, for example. Upon reception of the write command signal at a high level and the main word line MWL1 at a high level, the MOS transistors MN11 and MN13 are both switched on, so that the input node B of the inverter INV1 falls to a low level, while the output node A of the inverter INV1 rises to a high level.

Then, due to this write operation, the output node A of the inverter INV1 that composes the flip-flop for the latch circuit 50 is kept to be at a high level.

Next, when the refresh command such as CBR is supplied to a chip or by a self-refresh operation, the refresh command signal is activated to a high level. Then, when the address of a memory cell connected to the main word line MWL1 is specified, the main word line MWL1 is activated to a high level. A high level voltage is applied to the gates of the MOS transistors MN11 and MN16 of the latch circuit 50 connected to the main word line MWL1. When the output node A of the flip-flop is at a high level (where a write history is present), the MOS transistor MN 15 is switched on, so that the sense flag signal line is coupled to the ground through the on-state MOS transistors MN15, MN16, and MN18, thereby going to a low level.

When the main word line and the refresh command signal are activated with the output node A of the flip-flop of the latch circuit 50 being High, the sense flag signal line is driven to a low level. The SAP/SAN driver 30 (refer to FIG. 2) supplies the High/low level sense amplifier drive signal SAP/SAN (refer to FIG. 3).

When write operation to a memory cell connected to the main word line MWL1 is performed but no write operation to a memory cell connected to the main word line MWL2 has been performed, a write operation is performed onto one of the two main word lines MWL1 and MWL2. Thus, the output node A of the flip-flop is kept at a high level. When a request for refreshing a memory cell connected to the main word line MWL2 is made, the MOS transistors MN17 and MN18 are switched on, so that the sense flag signal line is driven to a low level. The SAP/SAN driver 30 (refer to FIG. 2) thus supplies the High/low level sense amplifier drive signal SAP/SAN (refer to FIG. 3).

When a write operation is performed onto neither the main word line MWL1 nor the main word line MWL2, and the output node A of the flip-flop of the latch circuit 50 is at a low level (with no write history), the sense flag signal is kept at a high level even if either of the main word lines MWL1 and MWL2 and the refresh command signal are activated. Thus, the SAP/SAN driver 30 (refer to FIG. 2) does not supply the High/low level sense amplifier drive signal SAP/SAN (refer to FIG. 3). In this manner, the write history may be stored based on a plurality (two, or equal to or larger than three) of the main word lines.

Well-known circuits are employed for the block selection signal generating circuit for generating the signal for activating a block connected to a word line and the circuit for generating the sense amplifier activation signal for controlling the sensing operation (refer to JP Patent No. 2991114, for example). The SAP/SAN driver 30 (in FIG. 2) performs control so that the sense amplifier activation signal is masked when the sense flag signal is not activated. Pull-up drive of the sense amplifier drive signal SAP to the power supply voltage and pull-down drive of the sense amplifier drive signal SAN to the ground potential are not thereby performed.

Figure 6:
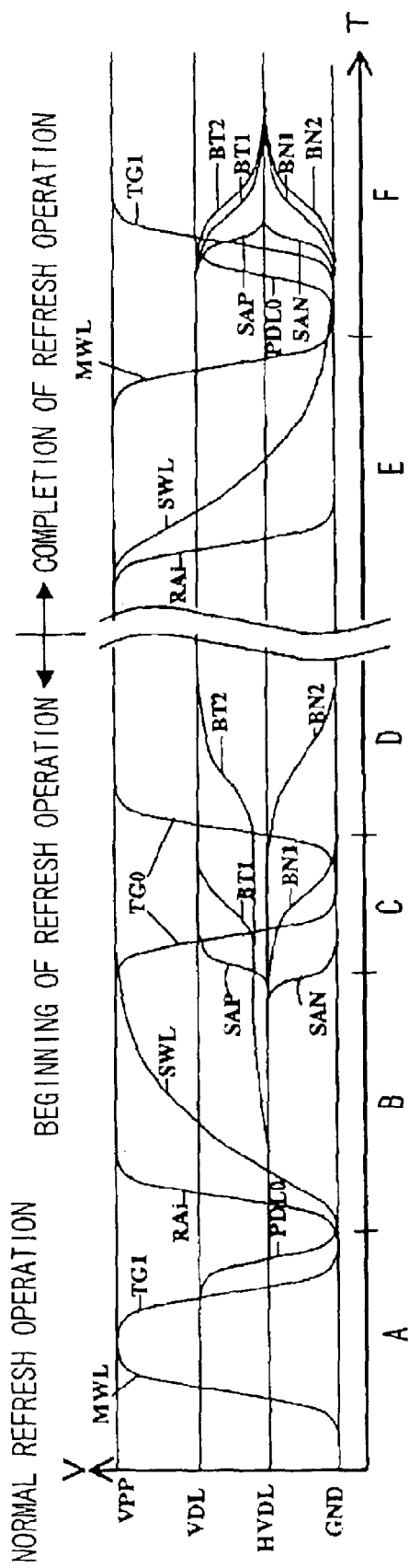
FIG. 6 is a waveform diagram illustrating signal waveforms during a refresh operation according to a first embodiment of the present invention.

FIG. 6 is a waveform diagram showing waveforms of signals for the refresh operation when a write history is written in a latch circuit 50 according to the embodiment of the present invention. This operation is the same as the normal refresh operation. Incidentally, the main word line MWL, sub-word line SWL, TG0, TG1, RAi, PDL0, PDL1, SAP, SAN, BT1, BN1, BT2, and BN2 in FIG. 6, and FIGS. 7 through 11 which will be referenced later, correspond to signals shown in FIG. 3, respectively. Further, referring to FIGS. 6 through 11, VPP denotes a high voltage (stepped-up voltage), VDL denotes a supply voltage (internal supply voltage), HVDL is an intermediate potential of VDL, corresponding to the precharge voltage for a bit line, and GND denotes the ground potential.

Referring to FIGS. 1 to 3 and FIG. 6 (a timing segment A in FIG. 6), a main word line MWL is selected, and the MWL then rises to a high-voltage VPP level. Then, the transfer gate control signal TG1 falls, and then the precharge control signal PDL0 falls. Due to the fall of the precharge control signal PDL0, a pair of the bite lines BT2 and BN2 are electrically disconnected to each other. The precharge control signal PLD1 for the pair of the bit lines BT3 and BN3 is kept at a high level. In the timing segment A, an sequence in which the main word line MWL rises, the transfer gate control signal TG1 falls, and the precharge control signal PDL0 falls is arbitrary.

Next, referring to a timing segment B in FIG. 6, the sub-word selection signal RAi rises to the VPP, so that a sub-word line SWL selected by the sub-word line driving circuit (SWD) 11 rises.

Figure 14:
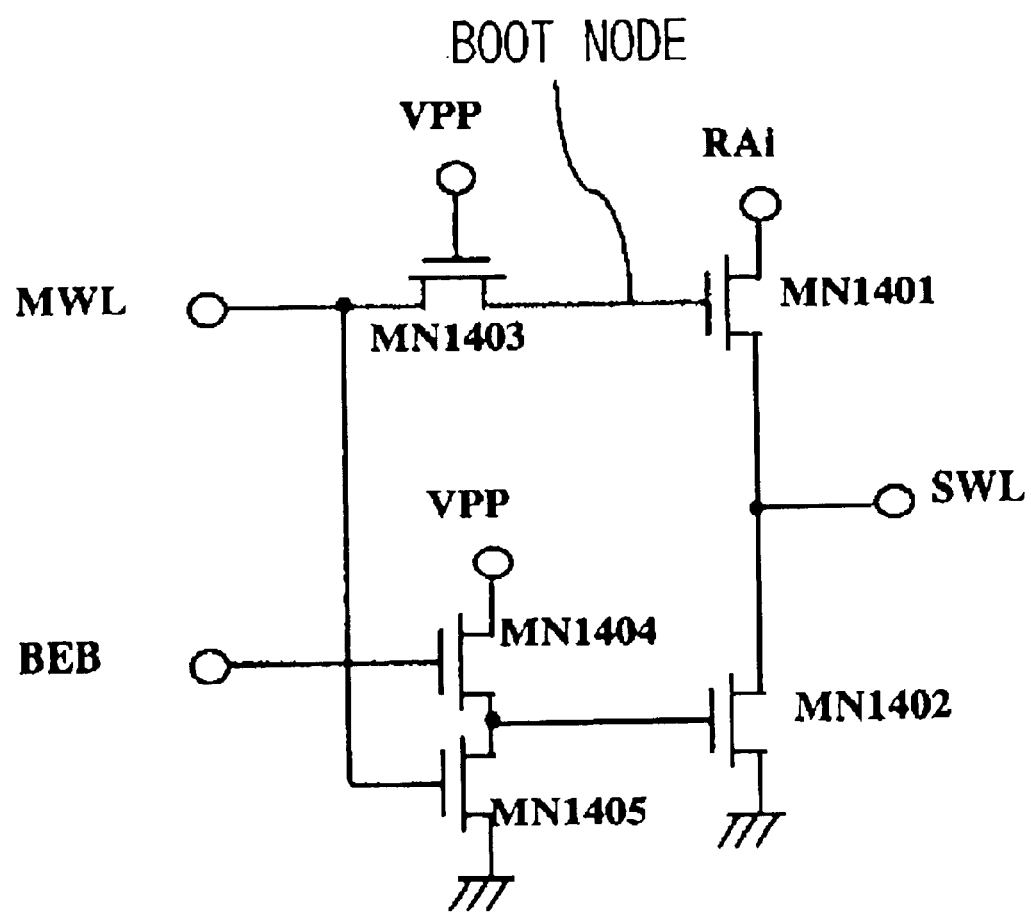
FIG. 14 is a diagram illustrating an example where a sub-word line drive circuit in the dynamic semiconductor memory device according to the embodiment of the present invention is constituted by a self-boot circuit.

If the sub-word line driving circuit (SWD) 11 is composed by a self-boot circuit that includes N-channel-MOS transistors alone, there is a need to always delay a timing of activation of the signal RAi from the rise of the main word line MWL. FIG. 14 is a diagram showing a circuit configuration of the self-boot circuit that composes the sub-word line driving circuit (SWD) 11. Referring to FIG. 14, the self-boot circuit is connected between the sub-word line power line RAi and the ground in series, and includes N-channel MOS transistors MN1401 and 1402 that constitute a driver for driving the sub-word line SWL. The main word line MWL is connected to the gate of the MOS transistor MN1401 through an N-channel MOS transistor MN1403, the gate of which receives the boosted voltage (high voltage) Vpp. The node (connecting point between the gates of the MOS transistors MN1403 and MN1401) is referred to as a boot node. When the sub-word line SWL is activated, the main word line MWL is activated to charge the boot node to a level lower then the VPP by a threshold voltage Vt of the N-channel MOS transistor MN1403. Then, the sub-word line power line RAi is raised. The boot node thereby rises to a high voltage level due to coupling between the channel and the gate of the N-channel MOS transistor MN1401, so that the sub-word line SWL supplied from a connecting point between the source of the N-channel MOS transistor MN1401 and the drain of the N-channel MOS transistor MN1402 may be raised to the high voltage level (VPP) of the sub-word line power line Rai. Between the power supply VPP and the ground, an N-channel MOS transistor MN1404 is connected to an N-channel MOS transistor MN1405 in series. A control signal BEB is supplied to the gate of the N-channel MOS transistor MN1404, while the main word line MWL is supplied to the gate of the N-channel MOS transistor MN1405. A connecting point between the source of the MOS transistor MN1404 and the drain of the MOS transistor MN1405 is connected to the gate of the N-channel MOS transistor MN1402. The control signal BEB is a control signal which is generated by inverting (complementing) the logic level of the block activation signal (refer to FIGS. 2 and 4) by an inverter or the like (not shown). When a block is activated, the control signal BEB is driven to a high level, so that the MOS transistor MN1404 is switched on. Then, a high level voltage is applied to the gate of the MOS transistor MN1402, so that the MOS transistor MN1402 is switched on, and the sub-word line SWL falls to the ground potential.

In response to the rise of the sub-word line SWL to the high voltage level (VPP), a memory cell is selected, and according to the storage status of the memory cell, a bit line changes to the high level or the low level. FIG. 6 shows an example where the selected memory cell stores the high level.

During a timing segment C in FIG. 6, in response to the sense amplifier signal for controlling the sensing operation and the sense flag signal indicating the status of activation, the potential of the sense amplifier drive signal SAP/SAN supplied from the SAP/SAN driver transitions from the HVDL to the VDL/GND.

Then, referring to the timing segment C, the transfer gate control signal TG0 is temporarily driven to a low level, the bit lines BT2 and BN2 are isolated from the sense amplifier, and then the loads of bit lines connected to the sense amplifier is reduced. The speed for reading is thereby improved. The bit lines pair BT1 and BN1 connected to the sense amplifier are differentially amplified by the sense amplifier, so that they become the VDL and GND levels, respectively.

Then, (referring to a timing segment D), the transfer gate control signal TG0 is raised to the VPP level again. The bit lines BT1 and BT2 (in a non-inverting side) are then electrically connected again, and the bit lines BN1 and BN2 (in an inverting side) are electrically connected again. The bit line BT2 in a memory array is then raised to the power supply voltage VDL, and the bit line BN2 in the memory array is lowered to the ground potential. With this arrangement, writing of data read through the sense amplifier is performed to the memory cell connected to the selected sub-word line, so that refresh is performed.

After completion of the refresh operation, the sub-word selection signal RAi supplied from the RAi driver (indicated by 110 in FIG. 1) falls to a low level. Then, the main word line MWL falls to a low level (refer to a timing segment E), the precharge control signal PDL0 goes to a high level, the transfer gate control signal TG1 goes to a high level, and then the bit lines BT1, BT2, BN1, and BN2 are precharged to the HVDL (refer to a timing segment F).

If a sub-word line is never selected after power-on, a memory cell connected to the sub-word line is kept at the HDVL level. Thus, even if the sub-word line is raised, the potentials of the bit lines BT2 and BN2 do not change from the precharge potential HVDL. In the present invention, in such a case, the refresh operation is not performed. On the other hand, with a conventional apparatus, even in this case, when the refresh command is asserted, the sense amplifier drive signal SAP/SAN is activated.

Next, assume that a write history is not held in the latch circuit 50, the sense flag signal is kept at a high level upon reception of the activated refresh command signal, and the drive control of the SAP/SAN driver (indicated by reference numeral 30 in FIG. 2) over the rise of the sense amplifier drive signal SAP (SAP↑) and the fall of the sense amplifier drive signal SAN (SAP↓) is stopped. Operations in this case will be described.

Figure 7:
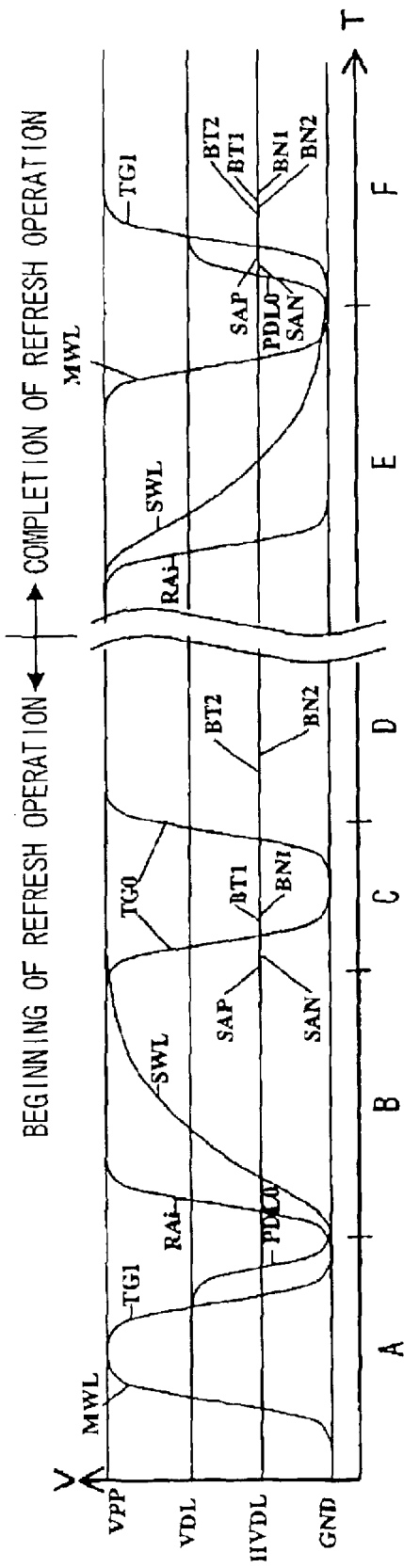
FIG. 7 is a waveform diagram illustrating signal waveforms at the time of inhibiting the refresh operation according to the first embodiment of the present invention.

FIG. 7 is a graph showing operations where the rise of the SAP (SAP↑) and the fall (SAP↓) of the SAN are stopped with the absence of the write history. As shown in FIG. 7, the sense amplifier drive signals SAP and SAN are fixed at the intermediate potential HVDL, so that the sense amplifier is not operated (the potential difference of the pair of bit lines is not amplified). For this reason, the pairs of the bit lines BT1 and BN1 and the BT2 and the BN2 remain unchanged at the HVDL. When the refresh operation is started, transition of the sense amplifier drive signals SAP and SAN is stopped, and these signals are kept at the HDVL level. At the time of a reset operation, these signals remain at the HDVL, so that their voltages are unchanged.

Next, another embodiment of the present invention in regard to the refresh current control will be described. A second embodiment of the present invention is so adapted that in case of the absence of the write history based on the output of the latch circuit 50 that stores the write history, the rise of the sub-word selection signal line (sub-word line power line) RAi is inhibited to stop the refresh operation, when the refresh command signal is received. For this purpose, in the second embodiment, the output of a latch circuit 50 (refer to FIGS. 1 and 4) is supplied to a RAi driver (refer to reference numeral 110 in FIG. 1) and the RAi driver outputs the signal RAi at the VPP level when the output signal of the latch circuit 50 (e.g. the sense flag signal in FIG. 4) is at a low level and the signal RAi at the ground potential when the output of the latch circuit 50 (sense flag signal in FIG. 4) is at a high level.

FIG. 8*a* shows an example of operation waveforms according to this embodiment, in which, in case no write history is present in the latch circuit 50, the rise of the sub-word selection signal line RAi is inhibited on receipt of the refresh command signal. At the time of starting the refresh operation, even if the main word line MWL rises, and the transfer gate control signal TG1 and the precharge control signal PDL0 fall, the sub-word selection signal RAi is kept at a low level. Accordingly, the output of the AND circuit (indicated by a reference numeral of 111, 112, 113, and 114 in FIG. 3) coupled to a sub-word line that should be selected is held at a low level, so that the sub-word line is not selected.

When the sense amplifier drive signal SAP/SAN is supplied from a SAP/SAN driver 30 (refer to FIG. 2), a sense amplifier 20 (refer to FIG. 2) performs differential amplification of the pair of the bit lines BT1 and BTN1 so that either one of the bit lines BT1 and BTN1 is driven to the power supply potential VDL and the other is driven to the ground potential GND. Then, in response to the rise of the transfer gate control signal TG0, the voltages of the pair of the bit lines BT2 and BN2 expand to the VDL and GND, respectively. In this case, both when the refresh operation is started and finished, the sub-word selection signal RAi and the sub-word line SWL are fixed at a low level.

FIG. 8*b* is a waveform diagram showing waveforms where the rise of the sense amplifier drive signal SAP (SAP↑) and the fall of the sense amplifier drive signal SAN (SAN↓) are stopped together with inhibition of the rise of the sub-word selection signal RAi at the time of the refresh operation, when no write history is retained in the latch circuit. In this case, the pair of the bit lines BT1 and BN1 and the pair of the bit lines BT2 and BN2 are maintained at the precharge potential HVDL.

In a third embodiment of the present invention in regard to the refresh current control, generation of the transfer gate control signal TG0 is stopped, based on a write history stored in the latch circuit 50. The transfer gate control signal TG0 switches transfer gates (MN104 and MN105 in FIG. 3) on and off to control electrical isolation between a sense amplifier and bit lines. In this embodiment, however, when no write history is stored in the latch circuit 50, the transfer gate control signal TG0 is kept at a high voltage level (at VPP), with no isolation control of the sense amplifier and the bit lines performed.

FIG. 9 is a diagram showing an example of operations according to the third embodiment of the present invention. It is the diagram showing signal waveforms where together with stopping of the rise of the sense amplifier drive signal SAP and the fall of the sense amplifier drive signal SAN (SAP↑, SAN↓), and stopping of the rise of the sub-word selection signal line RAi (RAi↑), the rise and fall of the transfer gate control signal TG0 (TG0↓↑) are stopped. In this embodiment, the output of the latch circuit 50 is supplied to the TG0 and TG1 driver (refer to FIG. 1) for driving and outputting the transfer gate control signals. The TG0 and TG1 drivers outputs a one-shot pulse of the transfer gate control signal TG0 when the output of the latch circuit 50 (sense flag signal in FIG. 4) is at a low level and outputs the transfer gate signal TG0 fixed at a high level.

Figure 10:
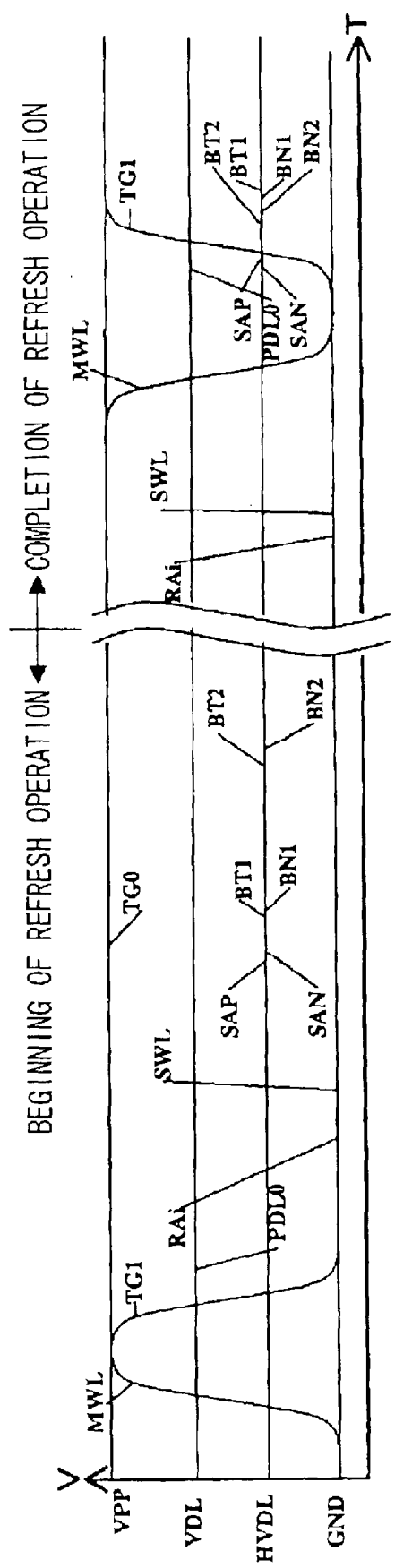
FIG. 10 is a waveform diagram illustrating signal waveforms at the time of inhibiting the refresh operation according to a fourth embodiment of the present invention.

In a fourth embodiment of the present invention in regard to the refresh current control, the precharge control signal may be controlled according to the presence or absence of a write history in the latch circuit 50. FIG. 10 is a diagram showing signal waveforms in case no write history is present in the latch circuit 50. In this case, together with stopping of fall of the precharge control signal PDL0 (PDL0↓), stopping of rise of the sense amplifier drive signal SAP and fall of the sense amplifier drive signal SAN (SAP↑, and SAN↓), and rise of the sub-word selection signal line RAi (RAi↑), and rise and fall of the transfer gate control signal TG0 (TG0↓↑) are stopped. The precharge control signal PDL0 is fixed at a high level. The pair of the bit lines BT2 and BN2 is fixed at the HVDL. In this embodiment, the output of the latch circuit 50 is supplied to a PDL0 driver (refer to FIG. 1) for driving and outputting the precharge control signal PDL0. The PDL0 driver is so configured to cause the precharge control signal PDL0 to fall during the sensing operation, when the output of the latch circuit 50 (sense flag signal in FIG. 4) is at a low level, and to keep the precharge control signal PDL0 at a high level even during the sensing operation, when the output of the latch circuit 50 (sense flag signal in FIG. 4) is at a high level.

Figure 11:
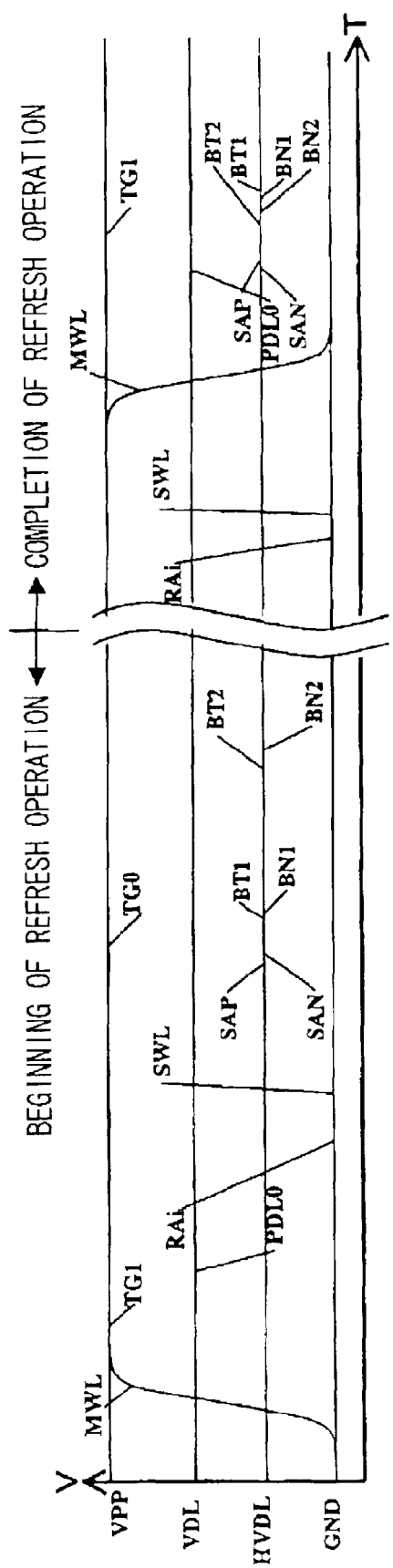
FIG. 11 is a waveform diagram illustrating signal waveforms at the time of inhibiting the refresh operation according to the fourth embodiment of the present invention.

In a fifth embodiment of the present invention in regard to the refresh current control, generation of the transfer gate control signal TG1 for the transfer gates (MN110 and MN111 in FIG. 3) inserted between a pair of bit lines (BT3 and BN3 in FIG. 3) for opposed memory cells and the sense amplifier is stopped. In this embodiment, control on isolation between the bit lines for opposed memory cells and the sense amplifier is not performed, so that the transfer gate control signal TG1 is held at the High voltage level (VPP). FIG. 11 is a diagram showing signal waveforms where the rise and fall of the transfer gate control signal TG1 is stopped, together with stopping of the rise of the sensing drive signal SAP (SAP↑) and the fall of the sensing drive signal SAN (SAN↓), stopping of the rise of the sub-word selection signal line RAi (RAi↑), stopping of one-shot pulse output of the transfer gate control signal TG0 (TG0↑↓), and stopping of the fall of the precharge control signal PDL0 (PDL0↓), the rise and fall of the transfer gate control signal TG1 are stopped. The output of the latch circuit 50 is supplied to a circuit for generating the transfer gate control signal TG1. This embodiment includes a circuit that performs following operations; when the output of the latch circuit (sense flag signal in FIG. 4, for example) is at a low level, the circuit causes the one-shot output of the transfer gate control signal TG1 to be performed. When the output of the latch circuit 50 (sense flag signal in FIG. 4, for example) is at a high level, the circuit causes the transfer gate control signal TG1 to be fixed at the high level. In this embodiment, transitions of the TG1, SAP, SAN, RAi, TG0, and PDL0 are stopped, so that the refresh current becomes the one that is involved only when the operation on the main word line MWL is performed.

The effect of reducing the refresh current due to stopping of the rise of the sense amplifier drive signal SAP and the fall of the sense amplifier drive signal SAN (SAP↑, SAN↓) is estimated at about 50%. Stopping of the rise of the sub-word selection signal line RAi (RAi↑) and transitions of the transfer gate control signal (TG0), precharge control signal (PDL0), and transfer gate control signal (TG1) achieve the effects of reducing the refresh current by about 5%, respectively.

The foregoing description about the present invention was directed to the embodiments described above. The present invention, however, is not limited to the embodiments described above, and includes various variations and modifications which could be achieved by a person skilled in the art within the scope of claims. The present invention, for example, is not limited to a DRAM having the hierarchical word line structure. Further, the present invention is not limited to a configuration where memory cell arrays are disposed on both sides of a sense amplifier, nor a configuration where a sense amplifier control circuit is provided in common among sense amplifier (SA) files. Further, the present invention is not limited to a synchronous DRAM and can be practiced for a dynamic semiconductor memory device having an arbitrary configuration.

The meritorious effects of the present invention are summarized as follows.

As described above, according to the present invention, when a write history is retained in the latch circuit and then a refresh command is received, a sensing operation is stopped. With this arrangement, refresh current can be remarkably reduced.

Furthermore, according to the present invention, the sensing operation is controlled based on a word line connected to a memory cell. Thus, while reducing the refresh current, a delay in selection of the word line during a write or a read operation can be avoided.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A dynamic semiconductor memory device comprising:
   a latch circuit for storing and holding information as to either presence or absence of a write history on a word line, based on a value of said word line and a value of a write command signal for commanding write operation; and
   a control circuit for exercising control so that, when a refresh command signal is activated,
   a refresh operation is performed, in case an output of said latch circuit indicates a value representative of the presence of the write history, and
   the refresh operation is stopped by canceling activation of a selected word line, and/or, by canceling at least part of a sensing operation by a sense amplifier, in case the output of said latch circuit indicates a value representative of the absence of the write history.

2. The dynamic semiconductor memory device according to claim 1, wherein said control circuit comprises a circuit for inactivating, at the time of said word line and said refresh command signal being activated, said control signal for controlling activation of a sense amplifier drive signal supplied as a power supply for driving said sense amplifier, thereby causing said sense amplifier drive signal to be in an inactive state, in case the output of said latch circuit indicates the value representative of the absence of the write history.

3. The dynamic semiconductor memory device according to claim 1, wherein said control circuit comprises a circuit for exercising control so that, when said word line and said refresh command signal are activated, said control signal for releasing precharge of a bit line is activated, thereby keeping said bit line at a precharge potential, in case the output of said latch circuit indicates the value representative of the absence of the write history.

4. The dynamic semiconductor memory device according to claim 1, further comprising a transfer gate inserted between said bit line connected to a memory cell and said sense amplifier, wherein
   said control circuit comprises a circuit for exercising control so that, when said word line and said refresh command signal are activated, said transfer gate is held in an on-state, in case the output of said latch circuit indicates the value representative of the absence of the write history.

5. The dynamic semiconductor memory device according to claim 1, wherein said sense amplifier is provided in common for a plurality of bit lines for a first memory cell array and a second memory cell array;
   wherein first and second transfer gates are provided between respective ones of said bit lines for the first and second memory arrays and said sense amplifier; and
   wherein said control circuit comprises a circuit for exercising control so that, when said word line and said refresh command signal are activated, said first and second transfer gates are held in an on-state, in case the output of said latch circuit indicates the value representative of the absence of the write history.

6. The dynamic semiconductor memory device according to claim 1, wherein said latch circuit comprises a flip-flop equipped with set and reset functions, said flip-flop being set to the value representative of the presence of the write history when said word line and said write command signal for commanding write operation are both activated.

7. The dynamic semiconductor memory device according to claim 1, wherein said latch circuit is reset to the value representative of the absence of the write history at power-on and/or in response to input of a reset command.

8. A dynamic semiconductor memory device comprising:
   a latch circuit receiving a word line supplied from a row decoder to a memory cell array and a write command signal for commanding write operation, for storing and holding a value representative of presence of a write history when said word line and said write command signal are activated; and
   a control circuit receiving a signal output from said latch circuit, said word line, and a refresh command signal for commanding a refresh operation on said word line,
   said control circuit exercising control so that,
   when said word line and said refresh command signal are activated,
   a refresh operation is performed, in case the output of said latch circuit indicates a value representative of the presence of the write history, and
   at least one of control signals for controlling a sensing operation by a sense amplifier is inactivated to stop the refresh operation on said word line, in case the output signal of said latch circuit indicates a value representative of the absence of the write history.

9. The dynamic semiconductor memory device according to claim 8, wherein a word line structure thereof is a hierarchical word line structure in which one of main word lines supplied from said row decoder comprises a plurality of sub-word lines, said latch circuit being arranged for each of said main word lines, said word line supplied to said latch circuit and said control circuit being said main word line.

10. The dynamic semiconductor memory device according to claim 9, wherein said control circuit comprises a circuit for executing control so that, when said word line and said refresh command signal are activated, said control signal for selecting one of said sub-word lines is held in an inactive state so as not to select said sub-word lines, in case the output of said latch circuit indicates the value representative of the absence of the write history.

11. The dynamic semiconductor memory device according to claim 8, wherein a word line structure thereof is a hierarchical word line structure in which one of main word lines supplied from said row decoder includes a plurality of sub-word lines, said latch circuit being arranged in common for a plurality of said main word lines, a plurality of main word lines being supplied as said word line to said latch circuit and said control circuit; and wherein in case no write operation is performed onto a plurality of said main word lines, said latch circuit holds the value representative of the absence of the write history, and under the condition that said latch circuit holds the value representative of the absence of the write history, the refresh operation is stopped for any of a plurality of said main word lines, when said refresh command signal supplied to said control circuit is activated.

12. The dynamic semiconductor memory device according to claim 8, wherein said control circuit comprises a circuit for inactivating, at the time of said word line and said refresh command signal being activated, said control signal for controlling activation of a sense amplifier drive signal supplied as a power supply for driving said sense amplifier, thereby causing said sense amplifier drive signal to be in an inactive state, in case the output of said latch circuit indicates the value representative of the absence of the write history.

13. The dynamic semiconductor memory device according to claim 8, wherein said control circuit comprises a circuit for exercising control so that, when said word line and said refresh command signal are activated, said control signal for releasing precharge of a bit line is activated, thereby keeping said bit line at a precharge potential, in case the output of said latch circuit indicates the value representative of the absence of the write history.

14. The dynamic semiconductor memory device according to claim 8, further comprising a transfer gate inserted between said bit line connected to a memory cell and said sense amplifier, wherein said control circuit comprises a circuit for exercising control so that, when said word line and said refresh command signal are activated, said transfer gate is held in an on-state, in case the output of said latch circuit indicates the value representative of the absence of the write history.

15. The dynamic semiconductor memory device according to claim 8, wherein said sense amplifier is provided in common for a plurality of bit lines for a first memory cell array and a second memory cell array;

wherein first and second transfer gates are provided between respective ones of said bit lines for the first and second memory arrays and said sense amplifier; and wherein said control circuit comprises a circuit for exercising control so that, when said word line and said refresh command signal are activated, said first and second transfer gates are held in an on-state, in case the output of said latch circuit indicates the value representative of the absence of the write history.

16. The dynamic semiconductor memory device according to claim 8, wherein said latch circuit comprises a flip-flop equipped with set and reset functions, said flip-flop being set to the value representative of the presence of the write history when said word line and said write command signal for commanding write operation are both activated.

17. The dynamic semiconductor memory device according to claim 8, wherein said latch circuit is reset to the value representative of the absence of the write history at power-on and/or in response to input of a reset command.

18. A dynamic semiconductor memory device comprising:

a flip-flop including first and second inverters, said first inverter having an input node connected to an output node of said second inverter, said second inverter having an input node connected to an output node of said first inverter;

first and second switching elements, connected between an input node of said flip-flop and a first power supply in series, having control terminals for receiving a word line supplied from a row decoder to a memory array and a write command signal for commanding write operation respectively to be controlled to turn on and off;

a third switching element, inserted between an output node of said flip-flop and said first power supply, having a control terminal for receiving a reset signal to be controlled to turn on and off;

a fourth switching element having a control terminal connected to the output node of said flip-flop to be controlled to turn on and off;

a fifth switching element having a control terminal for receiving said word line to be controlled to turn on and off;

a sixth switching element a control terminal for receiving a refresh command signal for commanding a refresh operation on said word line to be controlled to turn on and off, said fourth to sixth switching elements being connected in series between an output control signal and said first power supply;

wherein when said memory cell array or a block is not selected, said output control signal is precharged to a potential indicative of being in an inactivate state;

wherein in case no write operation is performed onto said word line, the output node of said flip-flop retains a first logic value, in case write operation is performed onto said word line, the first logic value is supplied to the input node of said flip-flop, the output node of said flip-flop being set to a second logic value;

wherein, when said word line and said refresh command signal are activated, said output control signal is held in the inactive state, in case the output node of said flip-flop takes the first logic value; and a control circuit, on receipt of said output control signal in the inactive state, canceling a sensing operation by a sense amplifier at a time of the refresh operation.

19. The dynamic semiconductor memory device according to claim 18, wherein said first switching element comprises:

a plurality of said first switching elements associated with a plurality of word lines, disposed in parallel between the input node of said flip-flop and said second switching element, having control terminals for receiving respective ones of said word lines to be controlled to turn on and off, and a plurality of said fifth switching elements associated with said plurality of word lines, disposed in parallel, having control terminals for receiving respective ones of said word lines to be controlled to turn on and off.

20. The dynamic semiconductor memory device according to claim 18, wherein said reset signal is activated at power-on and/or in response to input of a reset command.

21. A dynamic semiconductor memory device including a memory cell array having a plurality of memory cells arranged in an array form, having a hierarchical word line structure in which one main word line comprises a plurality of sub-word lines, said dynamic semiconductor memory device comprising:

a latch circuit for holding a write history associated with each of plurality of units, each of said units partitioned by said main word line, a plurality of said memory cells connected to respective ones of said plurality of sub-word lines associated with said main word line composing said unit; and a control circuit for controlling activation and inactivation of a selected sub-word line, based on the write history information latched by said latch circuit, when a refresh command for memory cells in one of said units is issued, thereby controlling whether to execute a refresh operation or not.

22. The dynamic semiconductor memory device according to claim 21, further comprising:

a circuit for exercising control so that, when said refresh command signal is issued, a precharge control signal is held in an activate state and a bit line is held at a precharge potential in case said latch circuit stores and holds the absence of the write history.

23. The dynamic semiconductor memory device according to claim 21, wherein said latch circuit further comprises:

a flip-flop including first and second inverters, said first inverter having an input node connected to an output node of said second inverter, said second inverter having an input node connected to an output node of said first inverter;

first and second switching elements connected in series between an input node of said flip-flop and a first power supply, having control terminals for receiving a word line supplied from a row decoder to said memory array and a write command signal for commanding write operation, respectively to be controlled to turn on and off;

a third switching element inserted between an output node of said flip-flop and said first power supply, having a control terminal for receiving a reset signal to be controlled to turn on and off;

a fourth switching element having a control terminal connected to the output node of said flip-flop to be controlled to turn on and off;

a fifth switching element having a control terminal for receiving said word line to be controlled to turn on and off; and a sixth switching element having a control terminal for receiving a refresh command signal for commanding the refresh operation on said word line to be controlled to turn on and off;

said fourth to sixth switching elements being connected in series between an output signal of said latch circuit and said first power supply;

wherein when said memory cell array or a block to which one of said units belongs is not selected, said output signal of said latch circuit is precharged to a potential indicative of an inactivate state;

wherein, in case no write operation is performed onto said word line, the output node of said flip-flop retains a first logic value, and in case write operation is performed onto said word line, the first logic value is supplied to the input node of said flip-flop, the output node of said flip-flop being set to a second logic value; and wherein, when said word line and said refresh command signal are activated, said output control signal is held in the inactive state, in case of the output node of said flip-flop being the first logic value.

24. The dynamic semiconductor memory device according to claim 23, comprising a plurality of said first switching elements associated with a plurality of word lines, a plurality of said first switching elements, disposed in parallel between the input node of said flip-flop and said second switching element, having control terminals for receiving respective ones of said word lines to be controlled to turn on and off; and a plurality of said fifth switching elements associated with said plurality of word lines, disposed in parallel between said fourth switching elements and said sixth switching elements, having control terminals for receiving respective ones of said word lines to be controlled to turn on and off.

25. The dynamic semiconductor memory device according to claim 21, comprising as a circuit for driving said one of said sub-word lines, one of a circuit for receiving said control signal for selecting said one of said sub-word lines and said main word line to supply a result of a predetermined logical operation on said input signal; and a self-boot circuit comprising a driver for receiving said control signal for selecting said one of said sub-word lines as a sub-word power supply composing a high level power supply to drive said one of said sub-word lines, said driver comprising first and second transistors of a same conductivity-type connected between said sub-word power supply and a low level power supply in series, said main word line being connected to a control terminal of said first transistor coupled to said sub-word power supply through a transfer gate, a control terminal of which a boosted voltage is applied to.

26. A dynamic semiconductor memory device including a memory cell array with a plurality of memory cells arranged in an array form, having a hierarchical word line structure in which one main word comprises a plurality of sub-word lines, the dynamic semiconductor memory device comprising:

a latch circuit for holding a write history associated with each of a plurality of units, each of said units partitioned by said main word line, a plurality of said memory cells connected to respective ones of said plurality of sub-word lines associated with said main word line composing said unit; and a control circuit for controlling activation and inactivation of a signal for controlling sensing operation by a sense amplifier associated with said latch circuit, based on the write history information latched by said latch circuit, when a refresh command for memory cells in one of said units is issued, thereby controlling whether to execute a refresh operation or not.

27. The dynamic semiconductor memory device according to claim 26 further comprising:
a circuit for exercising control so that when said refresh command signal is issued and said latch circuit stores and holds the absence of the write history, activation of a sense amplifier drive signal supplied for driving said sense amplifier is stopped.

28. The dynamic semiconductor memory device according to claim 27, wherein when said sense amplifier drive signal is inactivated, said sense amplifier drive signal is held at a level half of a power supply voltage.

29. The dynamic semiconductor memory device according to claim 26, wherein an output of said latch circuit is supplied to a circuit for delivering a control signal for selecting one of said sub-word lines; and
wherein, when said refresh command signal is issued, said control signal for selecting said one of said sub-word lines is inactivated, thereby causing said one of said sub-word lines not to be selected, in case said latch circuit stores and holds the absence of the write history.

30. The dynamic semiconductor memory device according to claim 26, further comprising:
a transfer gate inserted between the bit line connected to one of said memory cells and said sense amplifier; and
a circuit for exercising control so that, when said refresh command signal is issued, said transfer gate is held in an on-state, in case said latch circuit stores and holds the absence of the write history.

31. The dynamic semiconductor memory device according to claim 26, wherein said sense amplifier is provided in common for bit lines for a first memory cell array and a second memory cell array;
wherein first and second transfer gates are provided between respective ones of said bit lines for said first and second memory arrays and said sense amplifier; and
wherein said latch circuit comprises a circuit for exercising control so that, when said refresh command signal is issued, said first and second transfer gates are held in an on-state, in case said latch circuit stores and holds the absence of the write history.

32. The dynamic semiconductor memory device according to claim 26, further comprising:
a circuit for exercising control so that, when said refresh command signal is issued, a precharge control signal is held in an activate state and a bit line is held at a precharge potential in case said latch circuit stores and holds the absence of the write history.

33. The dynamic semiconductor memory device according to claim 26, wherein said latch circuit further comprises:
a flip-flop including first and second inverters, said first inverter having an input node connected to an output node of said second inverter, said second inverter having an input node connected to an output node of said first inverter;
first and second switching elements connected in series between an input node of said flip-flop and a first power supply, having control terminals for receiving a word line supplied from a row decoder to said memory array and a write command signal for commanding write operation, respectively to be controlled to turn on and off;
a third switching element inserted between an output node of said flip-flop and said first power supply, having a control terminal for receiving a reset signal to be controlled to turn on and off;
a fourth switching element having a control terminal connected to the output node of said flip-flop to be controlled to turn on and off;
a fifth switching element having a control terminal for receiving said word line to be controlled to turn on and off; and
a sixth switching element having a control terminal for receiving a refresh command signal for commanding the refresh operation on said word line to be controlled to turn on and off;
said fourth to sixth switching elements being connected in series between an output signal of said latch circuit and said first power supply;
wherein when said memory cell array or a block to which one of said units belongs is not selected, said output signal of said latch circuit is precharged to a potential indicative of an inactivate state;
wherein, in case no write operation is performed onto said word line, the output node of said flip-flop retains a first logic value, and in case write operation is performed onto said word line, the first logic value is supplied to the input node of said flip-flop, the output node of said flip-flop being set to a second logic value; and
wherein, when said word line and said refresh command signal are activated, said output control signal is held in the inactive state, in case of the output node of said flip-flop being the first logic value.

34. The dynamic semiconductor memory device according to claim 26, comprising as a circuit for driving said one of said sub-word lines,
one of a circuit for receiving said control signal for selecting said one of said sub-word lines and said main word line to supply a result of a predetermined logical operation on said input signal; and
a self-boot circuit comprising a driver for receiving said control signal for selecting said one of said sub-word lines as a sub-word power supply composing a high level power supply to drive said one of said sub-word lines, said driver comprising first and second transistors of a same conductivity-type connected between said sub-word power supply and a low level power supply in series, said main word line being connected to a control terminal of said first transistor coupled to said sub-word power supply through a transfer gate, a control terminal of which a boosted voltage is applied to.

35. A method of controlling refresh operation on a dynamic semiconductor memory device, said method comprising the steps of:
storing and holding a value representative of presence of a write history in a latch circuit when a word line supplied from a row decoder to a memory cell array and a write command signal for commanding write operation are activated;
exercising control so that, when said word line and a refresh command signal for commanding a refresh operation on said word line are activated, a refresh operation is performed in case an output of said latch circuit indicates the value representative of the presence of the write history,
while activation of a selected word line is stopped and/or stopping at least part of a sensing operation by a sense amplifier is stopped, in case the output of said latch circuit indicates a value representative of absence of the write history, thereby reducing refresh current in comparison with refresh current consumed by said normal refresh operation.

36. The method according to claim 35, wherein a word line structure thereof is a hierarchical word line structure in which one of main word lines supplied from said row decoder comprises a plurality of sub-word lines;
   wherein said latch circuit provided for each of said main word lines; and
   wherein said main word line is supplied to said latch circuit as said word line.

37. The method according to claim 35, wherein a word line structure thereof is a hierarchical word line structure in which one of main word lines supplied from said row decoder includes a plurality of sub-word lines, said latch circuit being arranged in common for a plurality of said main word lines, a plurality of said main word lines being supplied as said word line to said latch circuit and said control circuit; and
   wherein in case no write operation is performed onto a plurality of said main word lines, said latch circuit holds the value representative of the absence of the write history, and
   under the condition that said latch circuit holds the value representative of the absence of the write history, the refresh operation is stopped for any of a plurality of said main word lines, when said refresh command signal supplied to said control circuit is activated.

38. The method according to claim 35, wherein, when said refresh command signal is activated, control is exercised so that supply of a sense amplifier drive signal for feeding power to said sense amplifier is stopped, in case of said latch circuit retaining the value representative of the absence of the write history.

39. The method according to claim 35, wherein, when said refresh command signal is activated, said signal for controlling release of precharge of said bit line is inactivated, in case of said latch circuit retaining the value representative of the absence of the write history.

40. The method according to claim 35, wherein, when said refresh command signal is activated, a transfer gate inserted between said bit line connected to a memory cell and said sense amplifier is kept to be in an on-state by a control circuit, in case of said latch circuit retaining the value representative of the absence of the write history.

41. The method according to claim 35, wherein said sense amplifier is provided in common for first bit lines for a first memory array and second bit lines for a second memory array,
   wherein first and second transfer gate are provided between said sense amplifier and respective ones of said first bit lines for said first memory array and said second bit lines for said second memory array, and
   wherein in case of said latch circuit retaining the value representative of the absence of the write history, said first and second transfer gate are maintained in the on-state, when said refresh command signal is activated.

42. The method according to claim 35, wherein said latch circuit is reset to the value representative of the absence of the write history at power-on and/or in response to entry of a reset command.

43. A method of controlling refresh operation on a dynamic semiconductor memory device, said method comprising the steps of:
   storing and holding a value representative of presence of a write history in a latch circuit when a word line supplied from a row decoder to a memory cell array and a write command signal for commanding write operation are activated;
   exercising control so that, when said word line and a refresh command signal for commanding a refresh operation on said word line are activated, a normal refresh operation is performed, in case an output of said latch circuit indicates the value representative of the presence of the write history and
   exercising control so that, when said word line and said refresh command signal for commanding a refresh operation on said word line are activated, at least one of control signals for controlling a sensing operation by a sense amplifier is inactivated to stop the refresh operation on said word line, thereby reducing refresh current in comparison with refresh current consumed by said normal refresh operation, in case the output of said latch circuit indicates a value representative of absence of the write history.

44. The method according to claim 43, wherein, when said refresh command signal is activated, control is exercised so that said control signal for selecting one of said sub-word lines is held in an inactivate state even if said one of said sub-word lines is selected, so as not to activate said selected one of said sub-word lines, in case of said latch circuit retaining the value representative of the absence of the write history.

45. The method according to claim 43, wherein a word line structure thereof is a hierarchical word line structure in which one of main word lines supplied from said row decoder comprises a plurality of sub-word lines;
   wherein said latch circuit provided for each of said main word lines; and
   wherein said main word line is supplied to said latch circuit as said word line.

46. The method according to claim 43, wherein a word line structure thereof is a hierarchical word line structure in which one of main word lines supplied from said row decoder includes a plurality of sub-word lines, said latch circuit being arranged in common for a plurality of said main word lines, a plurality of said main word lines being supplied as said word line to said latch circuit and said control circuit; and
   wherein in case no write operation is performed onto a plurality of said main word lines, said latch circuit holds the value representative of the absence of the write history, and
   under the condition that said latch circuit holds the value representative of the absence of the write history, the refresh operation is stopped for any of a plurality of said main word lines, when said refresh command signal supplied to said control circuit is activated.

47. The method according to claim 43, wherein, when said refresh command signal is activated, control is exercised so that supply of a sense amplifier drive signal for feeding power to said sense amplifier is stopped, in case of said latch circuit retaining the value representative of the absence of the write history.

48. The method according to claim 43, wherein, when said refresh command signal is activated, said signal for controlling release of precharge of said bit line is inactivated, in case of said latch circuit retaining the value representative of the absence of the write history.

49. The method according to claim 43, wherein, when said refresh command signal is activated, a transfer gate inserted between said bit line connected to a memory cell and said sense amplifier is kept to be in an on-state by a control circuit, in case of said latch circuit retaining the value representative of the absence of the write history.

50. The method according to claim 43, wherein said sense amplifier is provided in common for first bit lines for a first memory array and second bit lines for a second memory array;

wherein first and second transfer gate are provided between said sense amplifier and respective ones of said first bit lines for said first memory array and said second bit lines for said second memory array; and wherein in case of said latch circuit retaining the value representative of the absence of the write history, said first and second transfer gate are maintained in the on-state, when said refresh command signal is activated.

51. The method according to claim 43, wherein said latch circuit is reset to the value representative of the absence of the write history at power-on and/or in response to entry of a reset command.

* * * * *